(12) United States Patent
Kim et al.

(10) Patent No.: US 11,830,874 B2
(45) Date of Patent: Nov. 28, 2023

(54) METHOD OF FABRICATING A SEMICONDUCTOR DEVICE

(71) Applicant: SAMSUNG ELECTRONICS CO., LTD., Suwon-si (KR)

(72) Inventors: Geunwoo Kim, Seoul (KR); Yoon Tae Hwang, Seoul (KR); Wandon Kim, Seongnam-si (KR); Hyunbae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 17/578,982

(22) Filed: Jan. 19, 2022

(65) Prior Publication Data

US 2022/0139910 A1 May 5, 2022

Related U.S. Application Data

(63) Continuation of application No. 16/860,279, filed on Apr. 28, 2020, now Pat. No. 11,233,050.

(30) Foreign Application Priority Data

Nov. 6, 2019 (KR) .................. 10-2019-0141059

(51) Int. Cl.
*H01L 27/088* (2006.01)
*H01L 29/49* (2006.01)
(Continued)

(52) U.S. Cl.
CPC .......... *H01L 27/088* (2013.01); *H01L 23/528* (2013.01); *H01L 23/5226* (2013.01); *H01L 29/4941* (2013.01)

(58) Field of Classification Search
CPC .............. H01L 23/5226; H01L 23/528; H01L 21/823475; H01L 21/76805; H01L 21/76849; H01L 21/76897; H01L 21/76847; H01L 27/088; H01L 29/0847; H01L 29/42392; H01L 29/78696; H01L 29/41791; H01L 29/78; H01L 29/4941;
(Continued)

(56) References Cited

U.S. PATENT DOCUMENTS 6,114,243 A 9/2000 Gupta et al.
6,541,374 B1 4/2003 DeFelipe et al.
(Continued)

FOREIGN PATENT DOCUMENTS

KR 10-0629260 B1 9/2006
KR 10-2017-0028549 A 3/2017

*Primary Examiner* — Wasiul Haider
(74) *Attorney, Agent, or Firm* — Lee IP Law, P.C.

(57) ABSTRACT

A semiconductor device including a substrate including an active pattern; a gate electrode crossing the active pattern and extending in a first direction; a source/drain pattern on the active pattern and adjacent to a side of the gate electrode; and an active contact in a contact hole on the source/drain pattern, wherein the active contact includes a first contact in a lower region of the contact hole, the first contact including a barrier pattern and a conductive pattern; a diffusion barrier layer on the first contact; and a second contact on the diffusion barrier layer, and a top surface of the diffusion barrier layer is coplanar with a top surface of the barrier pattern of the first contact.

20 Claims, 31 Drawing Sheets

(51) Int. Cl.
*H01L 23/522* (2006.01)
*H01L 23/528* (2006.01)

(58) Field of Classification Search
CPC ......... H01L 21/76844; H01L 21/02107–0228; H01L 21/762
See application file for complete search history.

(56) References Cited

U.S. PATENT DOCUMENTS

| | | |
|---|---|---|
| 6,905,964 B2 | 6/2005 | Lim et al. |
| 7,312,147 B2 | 12/2007 | Han |
| 7,335,590 B2 | 2/2008 | Suh et al. |
| 7,374,584 B2 | 5/2008 | Wang et al. |
| 7,544,601 B2 | 6/2009 | Hong |
| 10,283,404 B2 | 5/2019 | Na et al. |
| 10,438,891 B2 | 10/2019 | Park et al. |
| 2010/0009533 A1 | 1/2010 | Shaviv et al. |
| 2013/0334454 A1 | 12/2013 | Koehler et al. |
| 2016/0071803 A1 | 3/2016 | Saito et al. |
| 2018/0254246 A1* | 9/2018 | Park .................. H01L 23/53209 |
| 2019/0273147 A1 | 9/2019 | Cheng et al. |
| 2020/0161220 A1 | 5/2020 | Chiu |
| 2021/0074805 A1 | 3/2021 | Lin et al. |
| 2021/0098469 A1* | 4/2021 | Yang ............... H01L 21/823821 |
| 2021/0098588 A1 | 4/2021 | Chung et al. |

\* cited by examiner

METHOD OF FABRICATING A SEMICONDUCTOR DEVICE

CROSS-REFERENCE TO RELATED APPLICATIONS

This is a continuation application based on pending application Ser. No. 16/860,279, filed Apr. 28, 2020, the entire contents of which is hereby incorporated by reference.

Korean Patent Application No. 10-2019-0141059, filed on Nov. 6, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Due to their small-sized, multifunctional, and/or low-cost characteristics, semiconductor devices are being esteemed as important elements in the electronic industry. The semiconductor devices may include a semiconductor memory device for storing data, a semiconductor logic device for processing data, or a hybrid semiconductor device including both of memory and logic elements. As the electronic industry advances, there is an increasing demand for semiconductor devices with improved characteristics. For example, semiconductor devices with high reliability, high performance, and/or multiple functions may be desirable. To achieve these characteristics, complexity and/or integration density of semiconductor devices may be increased.

SUMMARY

The embodiments may be realized by providing a semiconductor device including a substrate including an active pattern; a gate electrode crossing the active pattern and extending in a first direction; a source/drain pattern on the active pattern and adjacent to a side of the gate electrode; and an active contact in a contact hole on the source/drain pattern, wherein the active contact includes a first contact in a lower region of the contact hole, the first contact including a barrier pattern and a conductive pattern; a diffusion barrier layer on the first contact; and a second contact on the diffusion barrier layer, and a top surface of the diffusion barrier layer is coplanar with a top surface of the barrier pattern of the first contact.

The embodiments may be realized by providing a semiconductor device including a substrate including an active pattern; a gate electrode crossing the active pattern and extending in a first direction; a source/drain pattern on the active pattern and adjacent to a side of the gate electrode; and an active contact in a contact hole on the source/drain pattern, wherein the active contact includes a first contact in a lower region of the contact hole, the first contact including a barrier pattern and a conductive pattern; a diffusion barrier layer on the first contact; and a second contact on the diffusion barrier layer, and an outer side surface of the diffusion barrier layer is in contact with an inner side surface of the barrier pattern of the first contact.

The embodiments may be realized by providing a semiconductor device including a substrate including a first active region and a second active region, which are spaced apart from each other in a first direction; a first active pattern on the first active region and a second active pattern on the second active region, the first active pattern and the second active pattern extending in a second direction crossing the first direction; a first source/drain pattern on an upper portion of the first active pattern and a second source/drain pattern on an upper portion of the second active pattern; gate electrodes crossing the first active pattern and the second active pattern and extending in the first direction, the gate electrodes being arranged in the second direction; an interlayered insulating layer covering the first source/drain pattern, the second source/drain pattern, and the gate electrodes; and an active contact in a contact hole on one of the first source/drain pattern and the second source/drain pattern, wherein the active contact includes a first contact in a lower region of the contact hole, the first contact including a first barrier pattern and a first conductive pattern; a diffusion barrier layer on the first contact; and a second contact on the diffusion barrier layer, a top surface of the first conductive pattern is recessed, such that a recess region is defined at an upper portion of the first contact by the top surface of the first conductive pattern and an inner side surface of the first barrier pattern, and the diffusion barrier layer is in the recess region.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
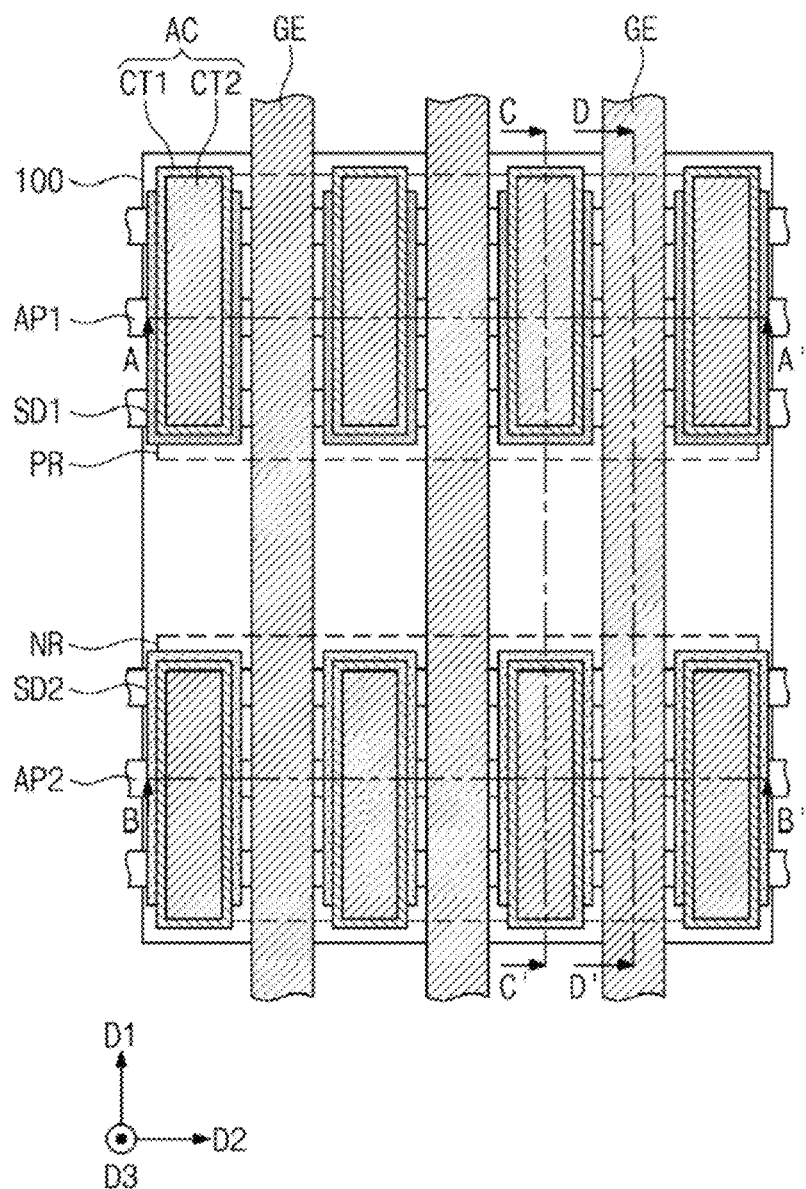
FIG. 1 illustrates a plan view of a semiconductor device according to an embodiment.

FIG. 1 is a plan view of a semiconductor device according to an embodiment. FIGS. 2A to 2D are sectional views, which are respectively taken along lines A-A', B-B', C-C', and D-D' of FIG. 1.

Referring to FIGS. 1 and 2A to 2D, a substrate 100 may include a first active region PR and a second active region NR. In an implementation, the first active region PR may be a PMOSFET region, and the second active region NR may be an NMOSFET region. The substrate 100 may be a semiconductor substrate, which is formed of or includes silicon, germanium, silicon-germanium, or the like, or a compound semiconductor substrate. In an implementation, the substrate 100 may be a silicon wafer.

In an implementation, the first and second active regions PR and NR may be logic cell regions, on which logic transistors constituting a logic circuit of the semiconductor device are disposed. In an implementation, logic transistors constituting a processor core or an I/O terminal may be on the logic cell region of the substrate 100. The first active region PR and the second active region NR may include some portions (e.g., source/drain electrodes) of the logic transistors.

The first and second active regions PR and NR may be defined by a second trench TR2, which is in an upper portion of the substrate 100. The second trench TR2 may be between the first and second active regions PR and NR. The first and second active regions PR and NR may be spaced apart from each other, in a first direction D1, with the second trench TR2 therebetween. Each of the first and second active regions PR and NR may extend (e.g., lengthwise) in a second direction D2 that is different from the first direction D1.

First active patterns AP1 and second active patterns AP2 may be on the first active region PR and the second active region NR, respectively. The first and second active patterns AP1 and AP2 may extend in the second direction D2 to be parallel to each other. The first and second active patterns AP1 and AP2 may be vertically protruding (e.g., in a vertical third direction D3) portions of the substrate 100. A first trench TR1 may be between adjacent ones of the first active patterns AP1 and between adjacent ones of the second active patterns AP2. The first trench TR1 may be shallower than the second trench TR2 (e.g., as measured in the third direction D3).

A device isolation layer ST may fill the first and second trenches TR1 and TR2. The device isolation layer ST may be formed of or include an insulating material (e.g., silicon oxide). Upper portions of the first and second active patterns AP1 and AP2 may protrude vertically above the device isolation layer ST. Each of the upper portions of the first and second active patterns AP1 and AP2 may be shaped like a fin. The device isolation layer ST may not cover the upper portions of the first and second active patterns AP1 and AP2. The device isolation layer ST may cover lower side surfaces of the first and second active patterns AP1 and AP2.

First source/drain patterns SD1 may be on the upper portions of the first active patterns AP1. The first source/drain patterns SD1 may be impurity regions of a first conductivity type (e.g., p-type). A first channel pattern CH1 may be between a pair of the first source/drain patterns SD1. Second source/drain patterns SD2 may be on the upper portions of the second active patterns AP2. The second source/drain patterns SD2 may be impurity regions of a second conductivity type (e.g., n-type). A second channel pattern CH2 may be between a pair of the second source/drain patterns SD2.

The first and second source/drain patterns SD1 and SD2 may be epitaxial patterns, which are formed by a selective epitaxial growth process. In an implementation, the first and second source/drain patterns SD1 and SD2 may have top surfaces (e.g., surfaces that face away from the substrate 100 in the third direction D3) that are coplanar with top surfaces of the first and second channel patterns CH1 and CH2. In an implementation, the top surfaces of the first and second source/drain patterns SD1 and SD2 may be higher than the top surfaces of the first and second channel patterns CH1 and CH2 (e.g., as measured in the third direction D3). In an implementation, the top surface of the first source/drain pattern SD1 or the second source/drain pattern SD2 may be lower than (or at a same level as) the top surface of the first channel pattern CH1 or the second channel pattern CH1 and CH2.

The first source/drain patterns SD1 may include a semiconductor element (e.g., SiGe) whose lattice constant is larger than a lattice constant of a semiconductor element in the substrate 100. Accordingly, the first source/drain patterns SD1 may exert a compressive stress on the first channel patterns CH1. In an implementation, the second source/drain patterns SD2 may include the semiconductor element (e.g., Si) as the substrate 100.

Gate electrodes GE may cross the first and second active patterns AP1 and AP2 and may extend (e.g., lengthwise) in the first direction D1. The gate electrodes GE may be spaced apart from each other in the second direction D2. The gate electrodes GE may be overlapped with the first and second channel patterns CH1 and CH2, when viewed in a plan view.

The gate electrode GE may include a first metal pattern and a second metal pattern on the first metal pattern. The first metal pattern may be on a gate dielectric pattern GI and adjacent to the first and second channel patterns CH1 and CH2. The first metal pattern may include a work function metal, which may be used to adjust a threshold voltage of the transistor. By adjusting a thickness and composition of the first metal pattern, it is possible to realize a transistor having a desired threshold voltage.

The first metal pattern may include a metal nitride. In an implementation, the first metal pattern may include, e.g., titanium (Ti), tantalum (Ta), aluminum (Al), tungsten (W), or molybdenum (Mo). As used herein, the term "or" is not an exclusive term, e.g., "A or B" would include A, B, or A and B. In an implementation, the first metal pattern may include, e.g., nitrogen (N). In an implementation, the first metal pattern may include, e.g., carbon (C). The first metal pattern may include a plurality of work function metal layers, which are stacked on the substrate 100.

The second metal pattern may include a metallic material whose resistance is lower than the first metal pattern. In an implementation, the second metal pattern may include, e.g., tungsten (W), aluminum (Al), titanium (Ti), or tantalum (Ta).

A pair of gate spacers GS may be on both side surfaces of each of the gate electrodes GE. The gate spacers GS may extend along the gate electrodes GE and in the first direction D1. Top surfaces of the gate spacers GS may be higher (e.g., farther from the substrate 100 in the third direction D3) than top surfaces of the gate electrodes GE. The top surfaces of the gate spacers GS may be coplanar with a top surface of a first interlayered insulating layer 110, which will be described below. The gate spacers GS may be formed of or include, e.g., SiCN, SiCON, or SiN. In an implementation, the gate spacers GS may have a multi-layered structure, which includes at least two different materials selected from SiCN, SiCON, and SiN.

A gate capping pattern GP may be on each of the gate electrodes GE. The gate capping pattern GP may extend along the gate electrode GE and in the first direction D1. The gate capping pattern GP may be formed of or include a material that has an etch selectivity with respect to first and second interlayered insulating layers 110 and 120 to be described below. In an implementation, the gate capping patterns GP may be formed of or include, e.g., SiON, SiCN, SiCON, or SiN.

The gate dielectric pattern GI may be between the gate electrode GE and the first active pattern AP1 and between the gate electrode GE and the second active pattern AP2. The gate dielectric pattern GI may extend along a bottom (e.g., substrate 100-facing) surface of the gate electrode GE thereon. In an implementation, the gate dielectric pattern GI may cover a first top surface TS1 and opposing first side surfaces SW1 of the first channel pattern CH1. The gate dielectric pattern GI may cover a second top surface TS2 and opposing second side surfaces SW2 of the second channel pattern CH2. The gate dielectric pattern GI may cover a top surface of the device isolation layer ST below the gate electrode GE (e.g., see FIG. 2D).

In an implementation, the gate dielectric pattern GI may be formed of or include a high-k dielectric material, whose dielectric constant is higher than that of silicon oxide. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The first interlayered insulating layer 110 may be on the substrate 100. The first interlayered insulating layer 110 may cover the gate spacers GS and the first and second source/drain patterns SD1 and SD2. A top surface of the first interlayered insulating layer 110 may be substantially coplanar with top surfaces of the gate capping patterns GP and the top surfaces of the gate spacers GS. A second interlayered insulating layer 120 may be on the first interlayered insulating layer 110 to cover the gate capping patterns GP. A third interlayered insulating layer 130 may be on the second interlayered insulating layer 120. The first to third interlayered insulating layers 110, 120, and 130 may be formed of or include silicon oxide.

A pair of isolation structures, which may be opposite to each other in the second direction D2, may be provided at both sides of a logic cell. The logic cell may include the first and second active regions PR and NR. The isolation structure may extend in the first direction D1 and parallel to the gate electrodes GE.

The isolation structure may penetrate the first and second interlayered insulating layers 110 and 120 and may extend in the first and second active patterns AP1 and AP2. The isolation structure may penetrate an upper portion of each of the first and second active patterns AP1 and AP2. The isolation structure may separate the first and second active regions PR and NR of the logic cell from an active region of a neighboring logic cell.

Figure 12A:
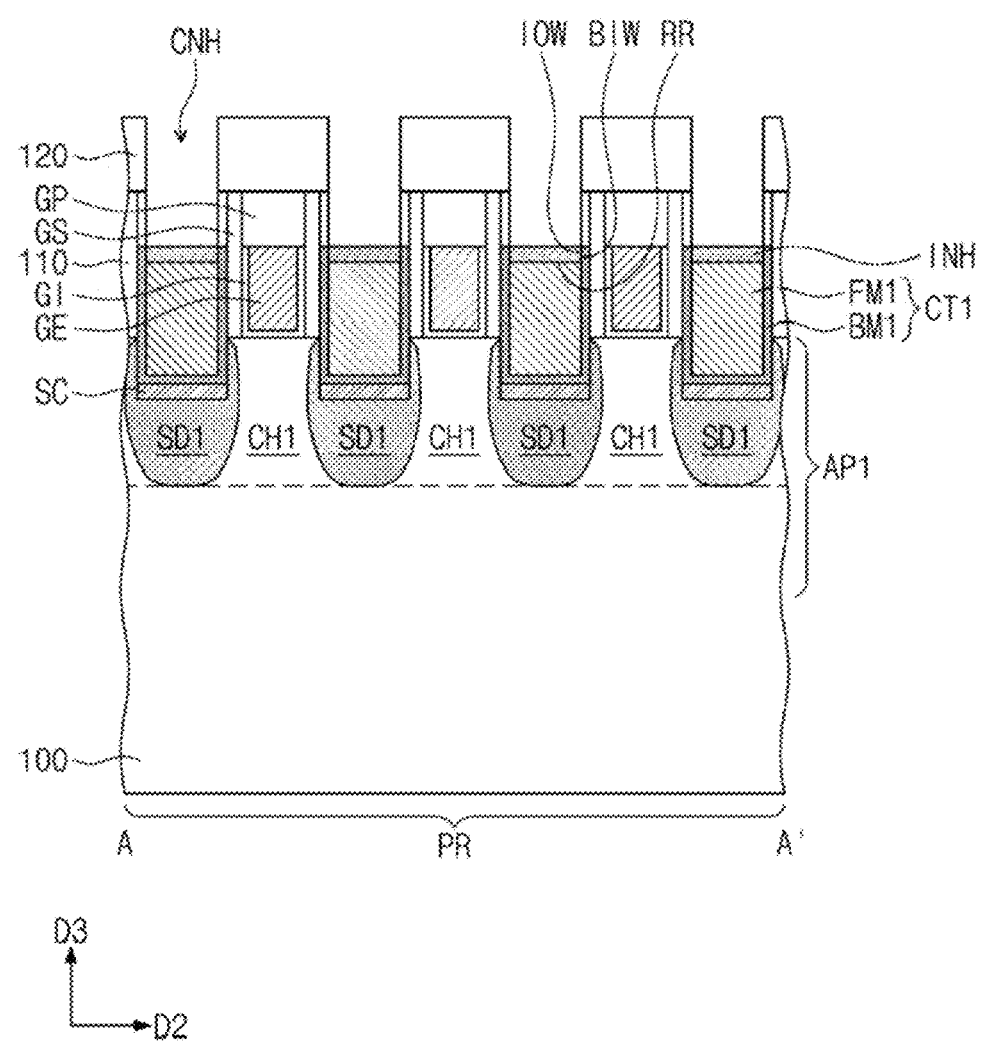
Figure 12B:
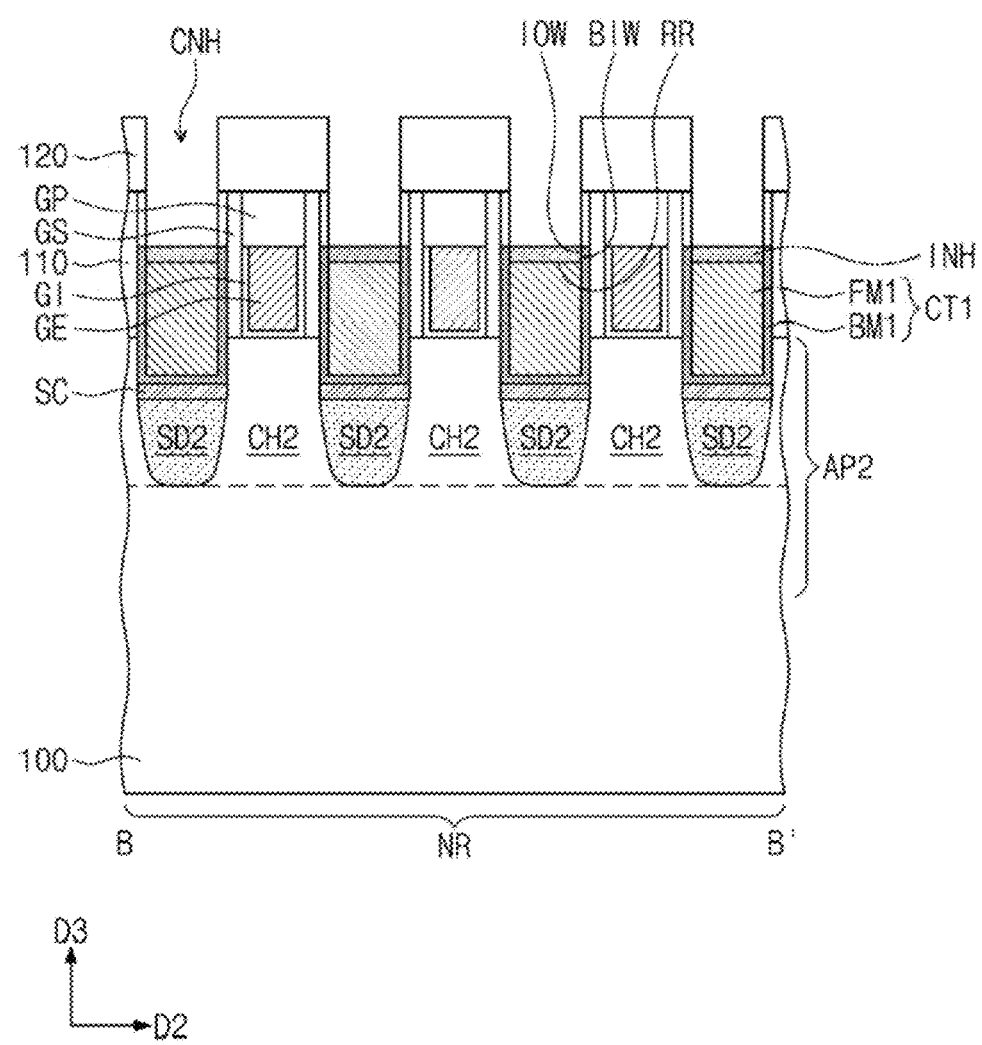
Figure 12C:
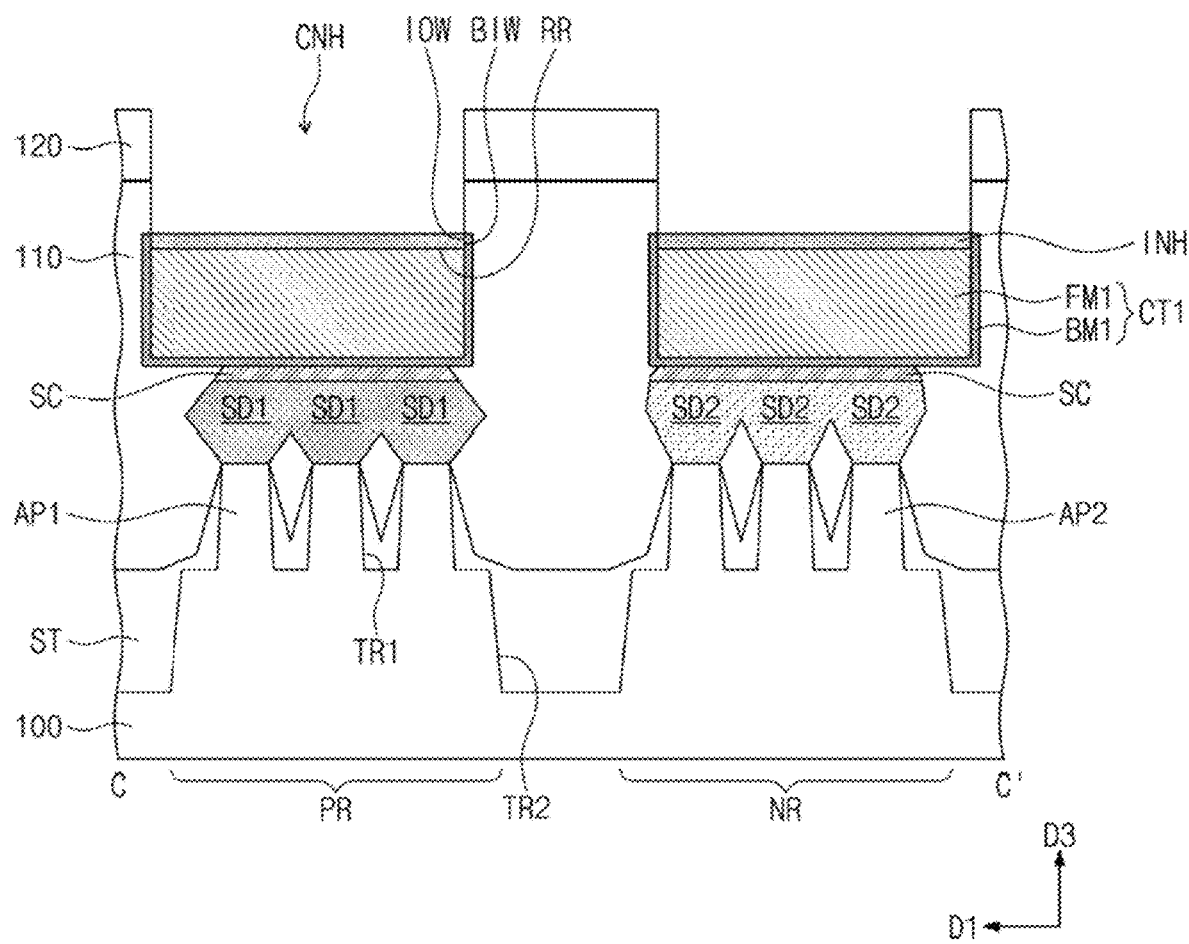

Active contacts AC may penetrate the first and second interlayered insulating layers 110 and 120 and may be electrically connected to the first and second source/drain patterns SD1 and SD2. In an implementation, a contact hole CNH may penetrate the first and second interlayered insulating layers 110 and 120 and expose the first or second source/drain pattern SD1 and SD2 (e.g., see FIGS. 12A to 12C). The active contact AC may be in the contact hole CNH. The active contact AC may be between a pair of the gate electrodes GE. A lower region of the contact hole CNH (e.g., proximate to the substrate 100 in the third direction D3) may be in the first interlayered insulating layer 110 and may have a first width in the first direction D1 or the second direction D2 and an upper region of the contact hole CNH (e.g., distal to the substrate 100 in the third direction D3) may be in the second interlayered insulating layer 120 and may have a second width in the first direction D1 or the second direction D2, the second width being less than the first width (see, e.g., FIG. 16).

Each of the active contacts AC may include a first contact CT1, a diffusion barrier layer INH on the first contact CT1, and a second contact CT2 on the diffusion barrier layer INH.

The first contact CT1 may be in a lower region of the contact hole CNH. The first contact CT1 may include a first barrier pattern BM1 and a first conductive pattern FM1. The first barrier pattern BM1 may be between the first conductive pattern FM1 and the first or second source/drain pattern SD1 and SD2. The first barrier pattern BM1 may cover both side surfaces and a bottom surface of the first conductive pattern FM1. The first barrier pattern BM1 may not cover a top surface of the first conductive pattern FM1.

The diffusion barrier layer INH may be on the first contact CT1. In an implementation, the diffusion barrier layer INH may be on the first conductive pattern FM1 of the first contact CT1, and a top surface of the diffusion barrier layer INH may be coplanar with a top surface of the first barrier pattern BM1 of the first contact CT1. In an implementation, the top surface of the diffusion barrier layer INH may be coplanar with the top surface of the first barrier pattern BM1 of the first contact CT1 and with a top surface of the first interlayered insulating layer 110 (see, e.g., FIG. 16). In an implementation, second interlayered insulating layer 120 may overlap with the top surface of the first barrier pattern BM1 of the first contact CT1 such that a width of the first contact CT1 in the first direction D1 or the second direction D2 is greater than a width of the second contact CT2 in the first direction D1 or the second direction D2.

In an implementation, the top surface of the first conductive pattern FM1 may be lower (e.g., closer to the substrate 100 in the third direction D3) than the top surface of the first barrier pattern BM1. A recess region RR may be defined by the top surface of the first conductive pattern FM1 and an inner side surface BIW of the first barrier pattern BM1, and the diffusion barrier layer INH may be formed in the recess region RR. Accordingly, an outer side surface IOW of the diffusion barrier layer INH may be in contact (e.g., direct contact) with the inner side surface BIW of the first barrier pattern BM1.

The second contact CT2 may be in an upper region of the contact hole CNH. The second contact CT2 may include a second barrier pattern BM2 and a second conductive pattern FM2. The second barrier pattern BM2 may cover both side surfaces of the second conductive pattern FM2. In an implementation, the second barrier pattern BM2 may be selectively formed on only both side surfaces of the second conductive pattern FM2, and a bottom surface of the second conductive pattern FM2 may be covered (e.g., in contact) with the diffusion barrier layer INH.

The outer side surface IOW of the diffusion barrier layer INH may be in contact with the first barrier pattern BM1, and the top surface of the diffusion barrier layer INH may be in contact with the bottom surface of the second conductive pattern FM2. Some of metallic elements in the second conductive pattern FM2 may be diffused to a neighboring pattern through the diffusion barrier layer INH. According to an embodiment, the diffusion barrier layer INH may be in the recess region RR and may be surrounded by the first conductive pattern FM1 and the first barrier pattern BM1. In an implementation, it is possible to effectively prevent the metallic elements in the second conductive pattern FM2 from being diffused to the outside of the active contact AC and to help improve the reliability of the semiconductor device.

The first and second barrier patterns BM1 and BM2 may be formed of or include a metal nitride (e.g., titanium nitride, tungsten nitride, or tantalum nitride). The first conductive pattern FM1 may be formed of or include a metallic material (e.g., aluminum, copper, tungsten, molybdenum, or cobalt). The second conductive pattern FM2 may be formed of or include a metallic material (e.g., aluminum, copper, tungsten, molybdenum, or cobalt). In an implementation, the second conductive pattern FM2 may include a metal material different from that of the first conductive pattern FM1. In an implementation, the first conductive pattern FM1 may be formed of or include tungsten, and the second conductive pattern FM2 may be formed of or include cobalt.

In an implementation, the diffusion barrier layer INH may include, e.g., acetylacetone or bis(diethylamino) silane. In an implementation, the diffusion barrier layer INH may have a thickness of, e.g., 5 Å to 50 Å (e.g., as measured in the third direction D3).

Referring back to FIG. 2A, the largest width of the first contact CT1 in the second direction D2 may be a first width W1, and the largest width of the second contact CT2 in the second direction D2 may be a second width W2. The first width W1 may be greater than the second width W2. The width of the first contact CT1 in the first direction D1 may also be greater than the width of the second contact CT2 in the first direction D1. In an implementation, the largest width of the second contact CT2 in the second direction D2 may be substantially equal to the largest width of the diffusion barrier layer INH in the second direction D2.

Referring back to FIGS. 1 and 2A to 2D, a silicide pattern SC may be between the active contact AC and the first source/drain pattern SD1 and between the active contact AC and the second source/drain pattern SD2. The active contact AC may be electrically connected to the second source/drain pattern SD1 or SD2 through the silicide pattern SC. The silicide pattern SC may be formed of or include a metal-silicide (e.g., titanium silicide, tantalum silicide, tungsten silicide, nickel silicide, or cobalt silicide).

The third interlayered insulating layer 130 may be on the second interlayered insulating layer 120. Interconnection lines M1 and first and second vias V1_a and V1_b may be in the third interlayered insulating layer 130. The interconnection line M1 may extend in the second direction D2. A cell boundary extending in the second direction D2 may be defined at both ends of the logic cell, and some of the interconnection lines M1 may be on the cell boundary. The interconnection lines M1 may be spaced apart from each other, by a specific distance, in the first direction D1.

The first and second vias V1_a and V1_b may be below the interconnection lines M1 (e.g., between the interconnection lines M1 and the substrate 100 in the third direction D3). The first vias V1_a may be respectively between the interconnection lines M1 and the active contacts AC to electrically connect the interconnection lines M1 to the active contacts AC. The second vias V1_b may be respectively between the interconnection lines M1 and the gate electrodes GE to electrically connect the interconnection lines M1 to the gate electrodes GE. The interconnection line M1 and the first or second via V1_a or V1_b may be formed by a damascene process or a dual damascene process.

Referring back to FIG. 2D, the gate electrode GE may face the first top surface TS1 of the first channel pattern CH1 and at least one of the first side surfaces SW1 of the first channel pattern CH1. The gate electrode GE may face the second top surface TS2 of the second channel pattern CH2 and at least one of the second side surfaces SW2 of the second channel pattern CH2. In an implementation, the transistor according to the present embodiment may be a three-dimensional field-effect transistor (e.g., FinFET), in which the gate electrode GE three-dimensionally surrounds the channel patterns CH1 and CH2.

Figure 10A:
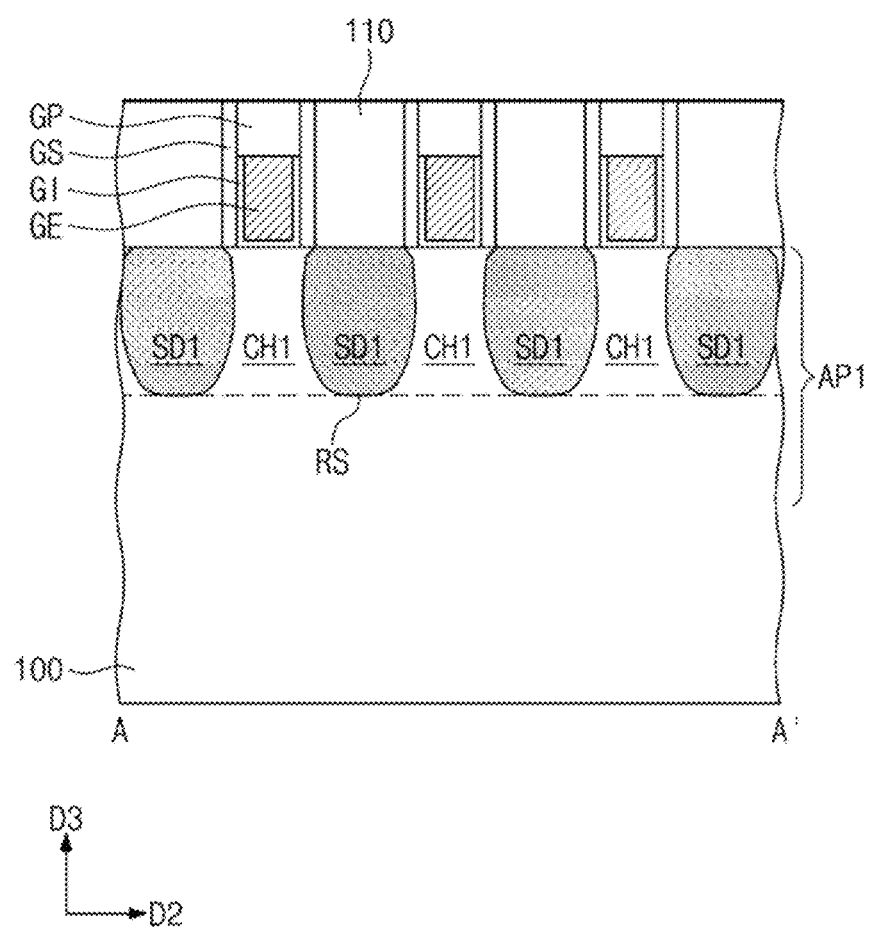
Figure 10B:
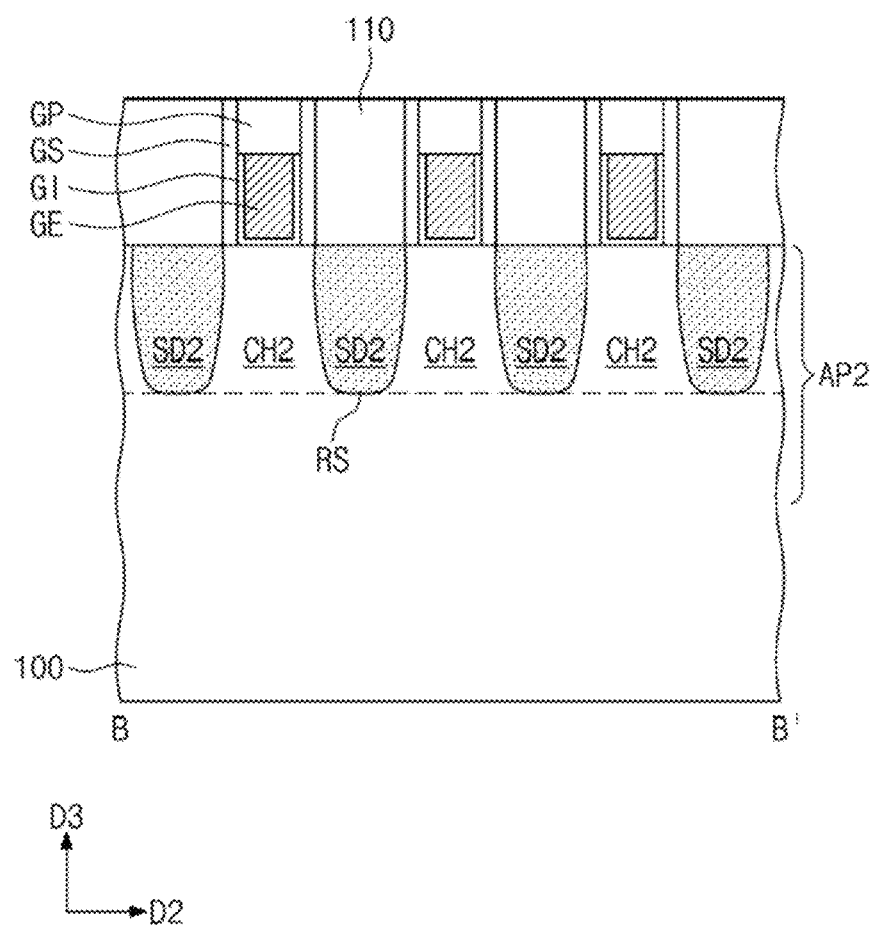
Figure 10C:
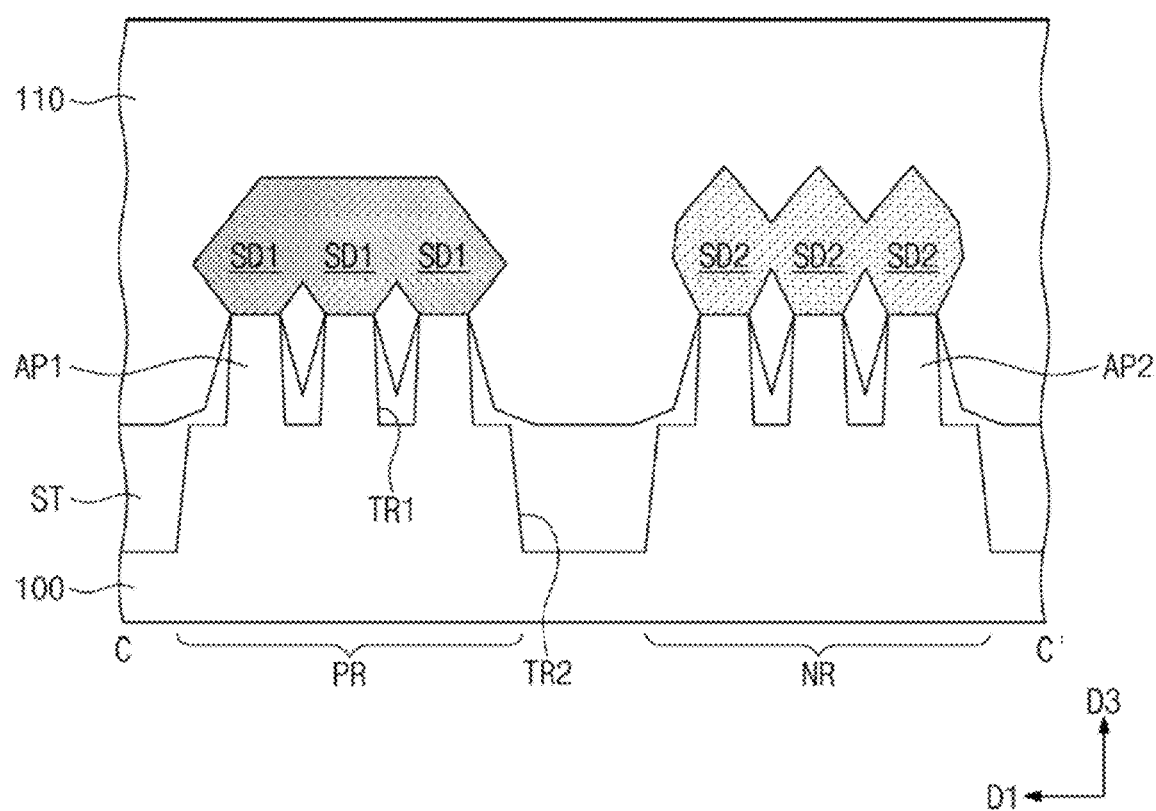
Figure 10D:
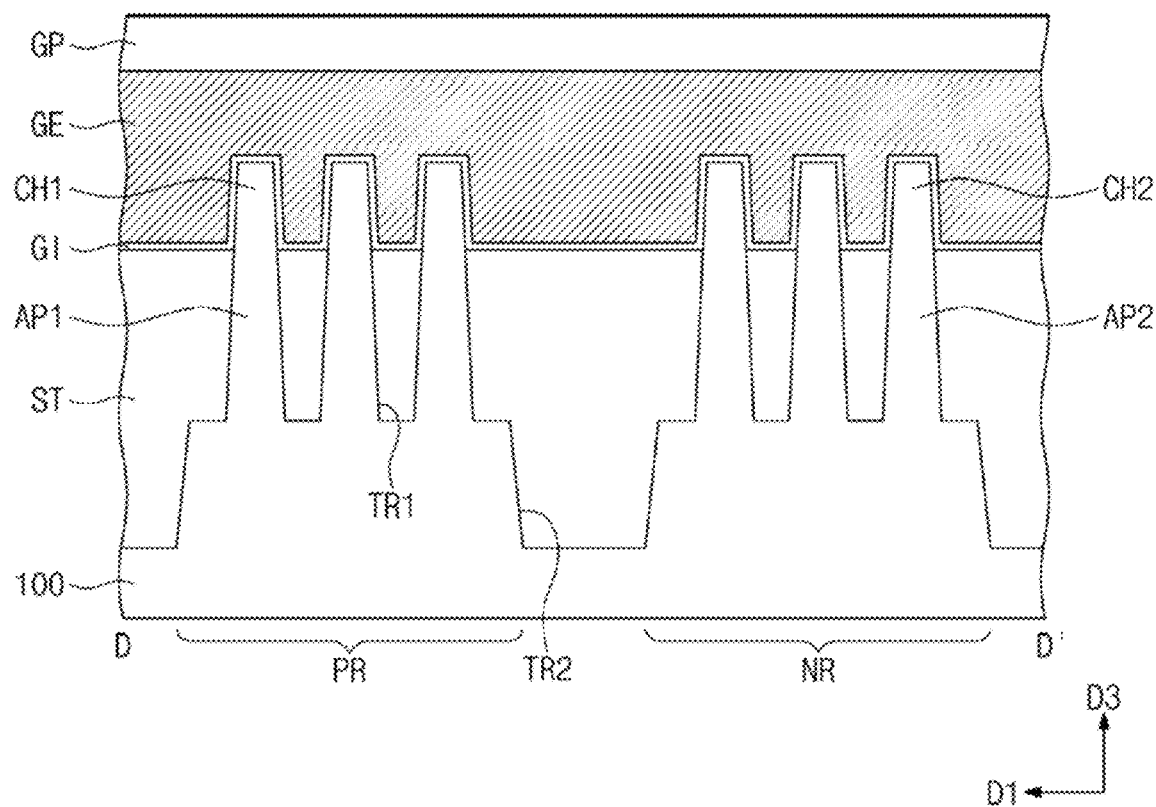
FIGS. 10D and 12D illustrate sectional views taken along lines D-D' of FIGS. 9 and 11, respectively.
Figure 11:
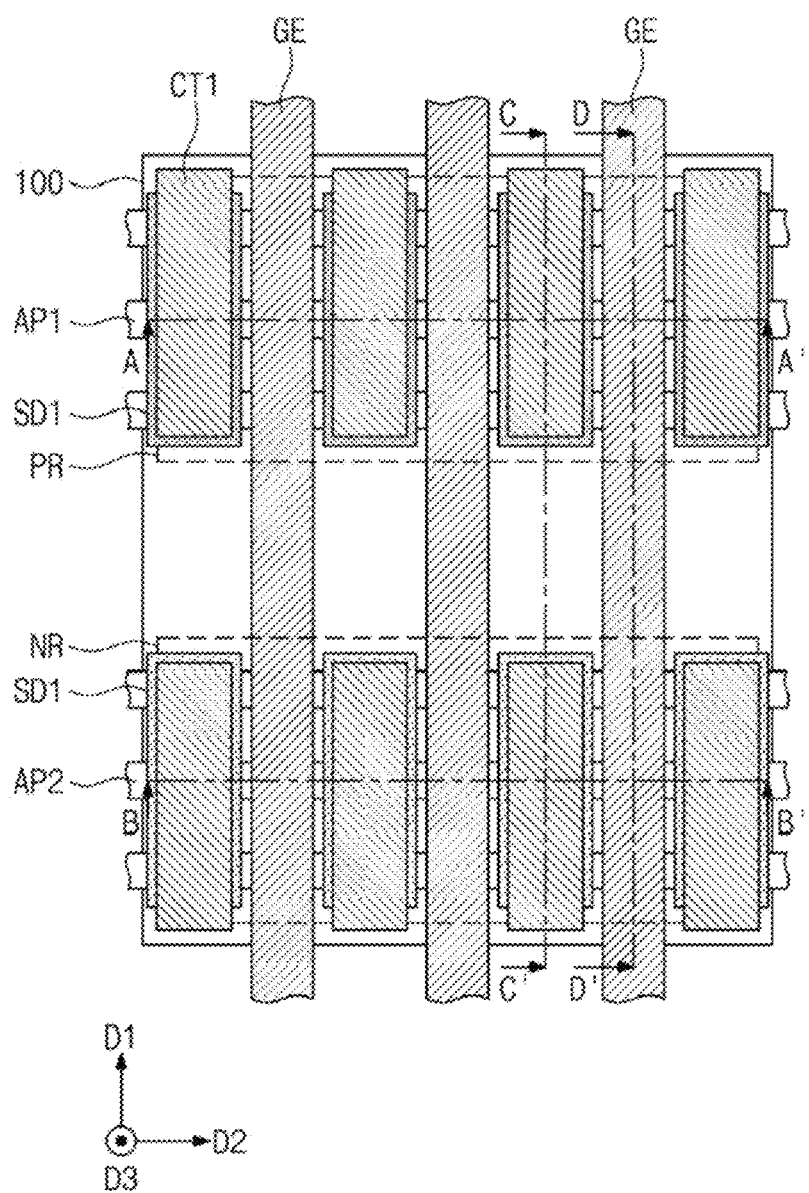
Figure 12D:
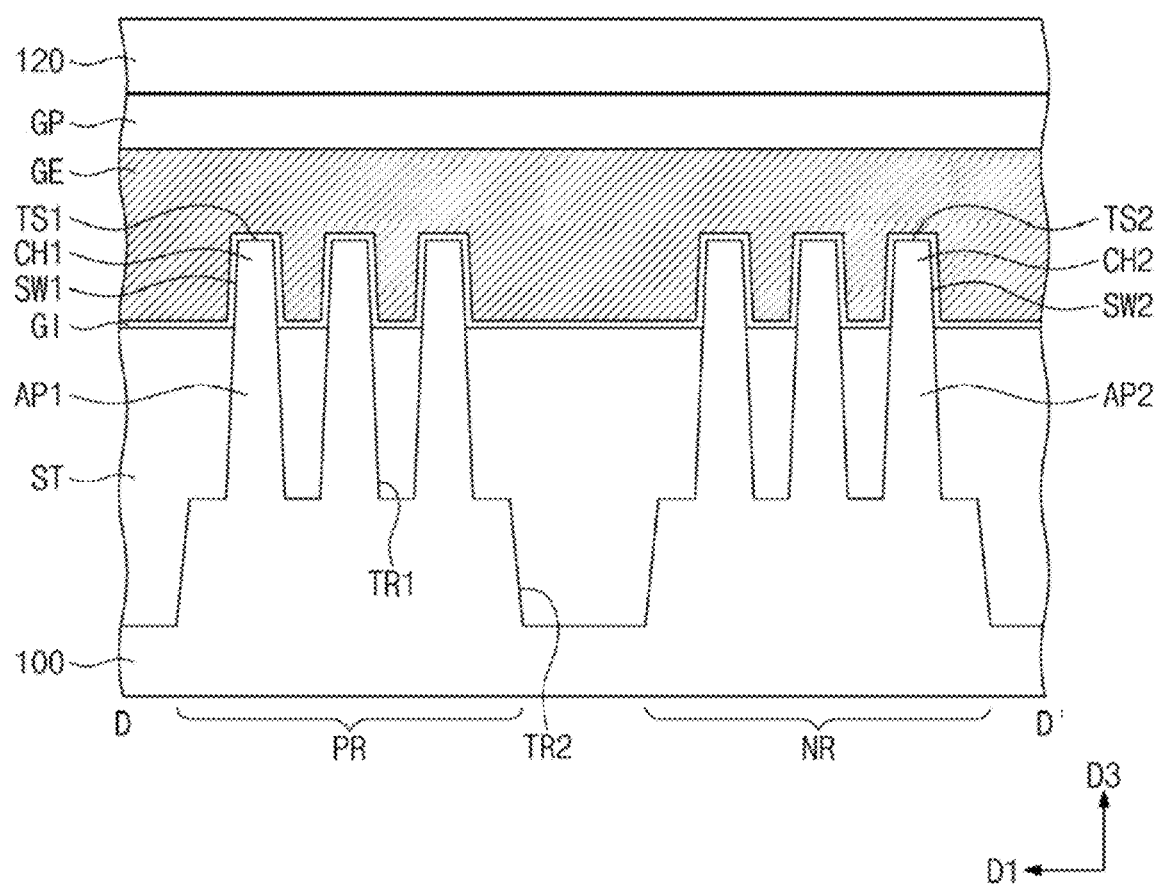

FIGS. 3, 5, 7, 9, and 11 are plan views of stages in a method of fabricating a semiconductor device, according to an embodiment. FIGS. 4, 6A, 8A, 10A, and 12A are sectional views taken along lines A-A' of FIGS. 3, 5, 7, 9, and 11, respectively. FIGS. 6B, 8B, 10B, and 12B are sectional views taken along lines B-B' of FIGS. 5, 7, 9, and 11, respectively. FIGS. 6C, 8C, 10C, and 12C are sectional views taken along lines C-C' of FIGS. 5, 7, 9, and 11, respectively. FIGS. 10D and 12D are sectional views taken along lines D-D' of FIGS. 9 and 11, respectively.

Figure 3:
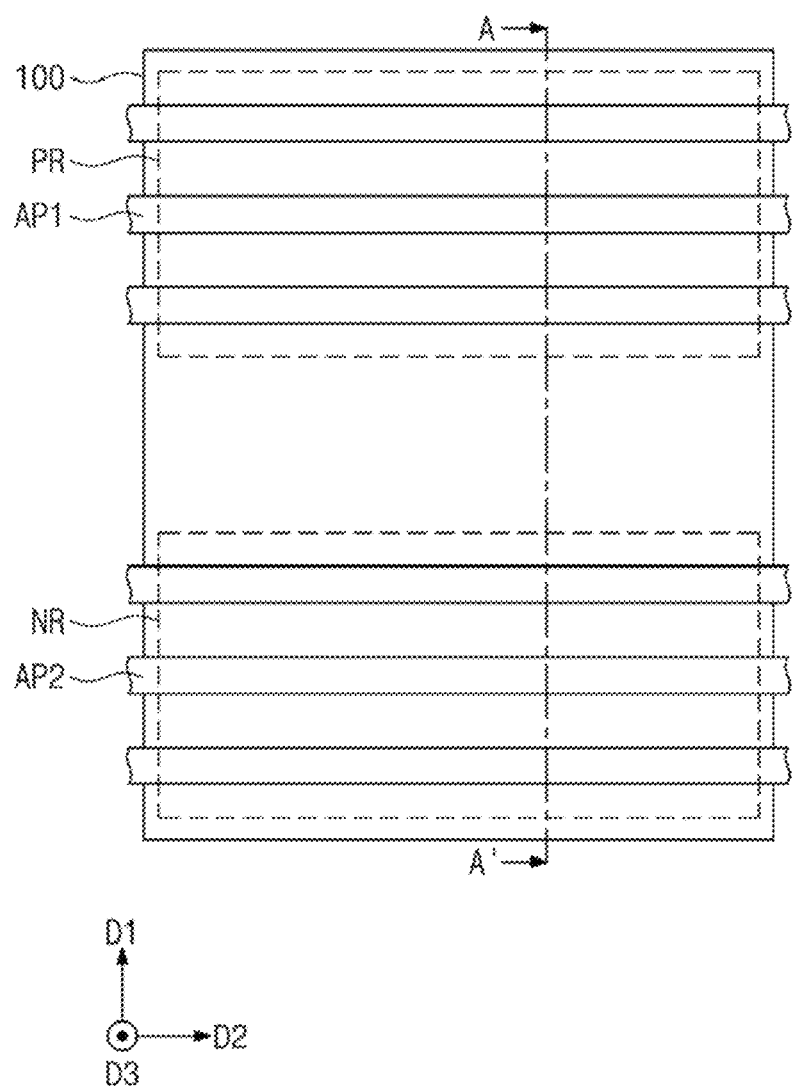
FIGS. 3, 5, 7, 9, and 11 illustrate plan views of stages in a method of fabricating a semiconductor device, according to an embodiment.
Figure 4:
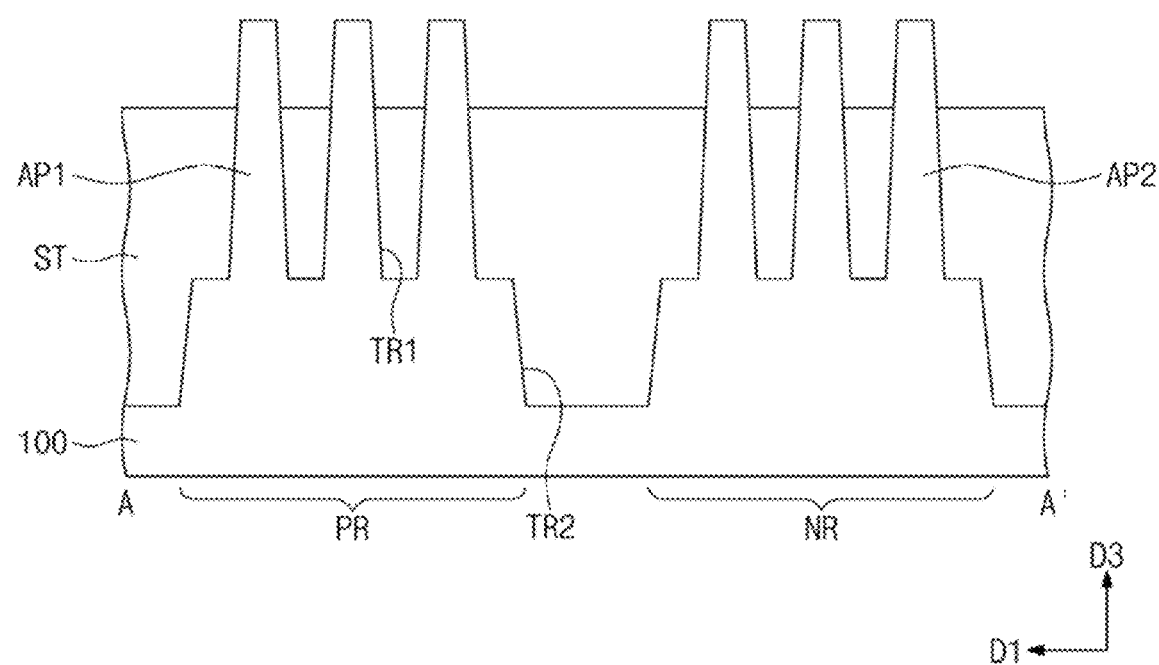
FIGS. 4, 6A, 8A, 10A, and 12A illustrate sectional views taken along lines A-A' of FIGS. 3, 5, 7, 9, and 11, respectively.
Figure 5:
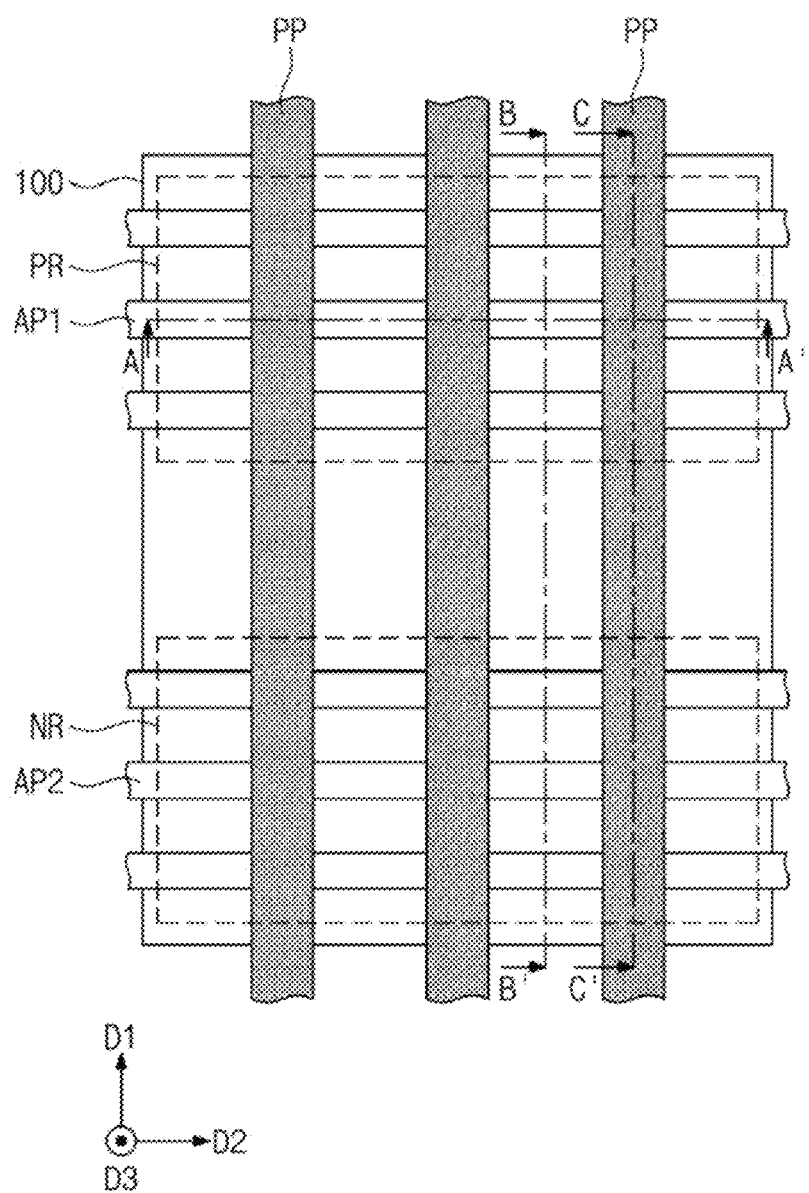
Figure 6A:
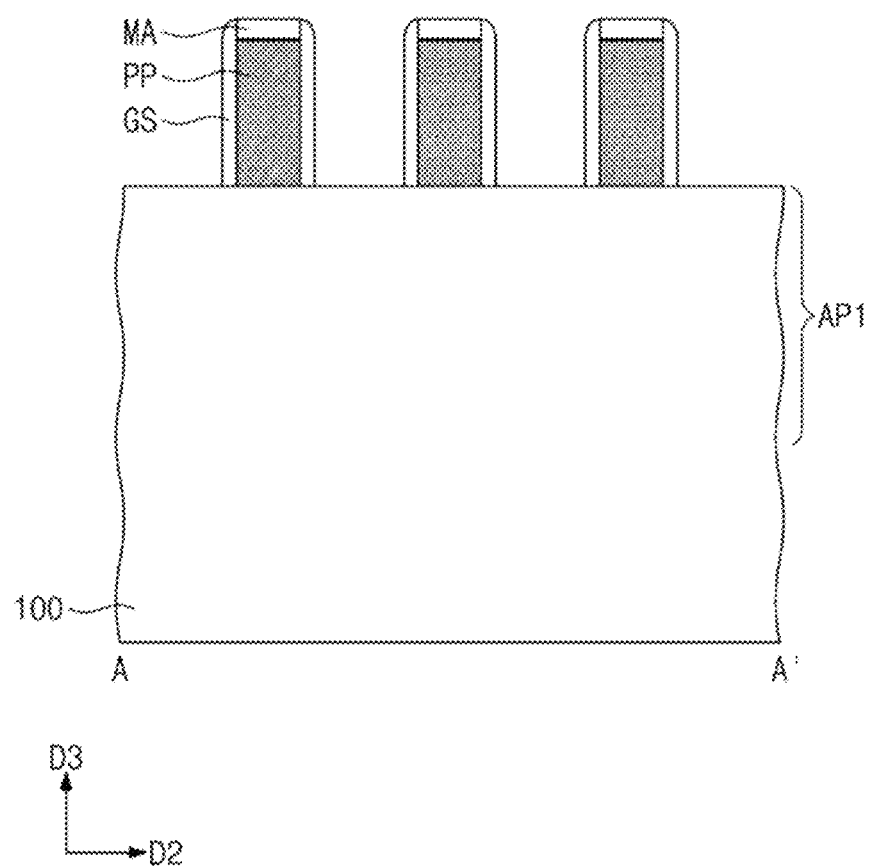
Figure 6B:
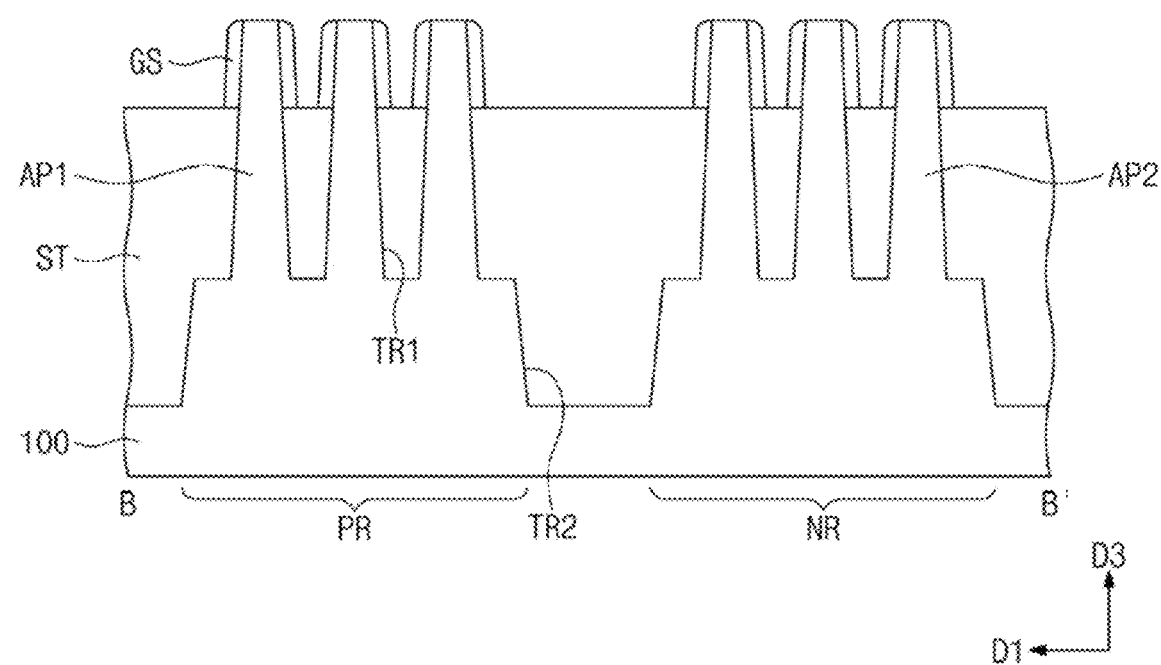
FIGS. 6B, 8B, 10B, and 12B illustrate sectional views taken along lines B-B' of FIGS. 5, 7, 9, and 11, respectively.
Figure 6C:
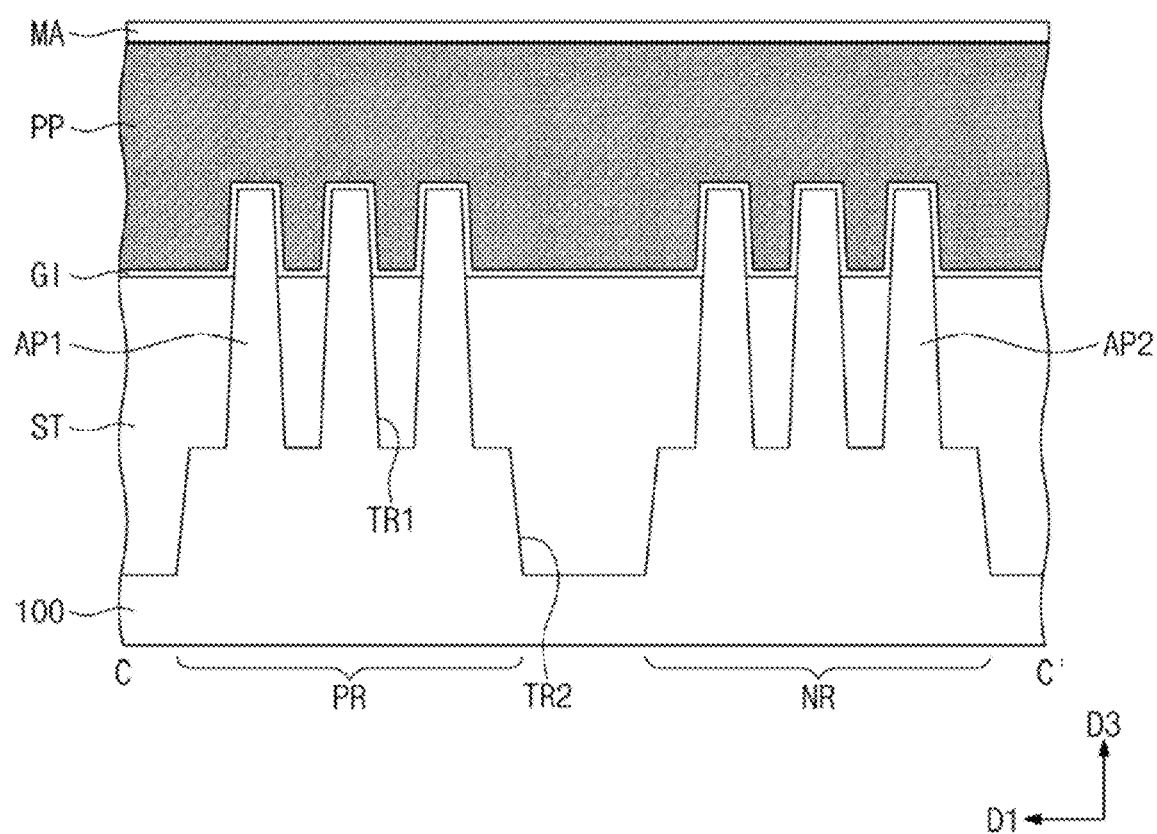
FIGS. 6C, 8C, 10C, and 12C illustrate sectional views taken along lines C-C' of FIGS. 5, 7, 9, and 11, respectively.
Figure 7:
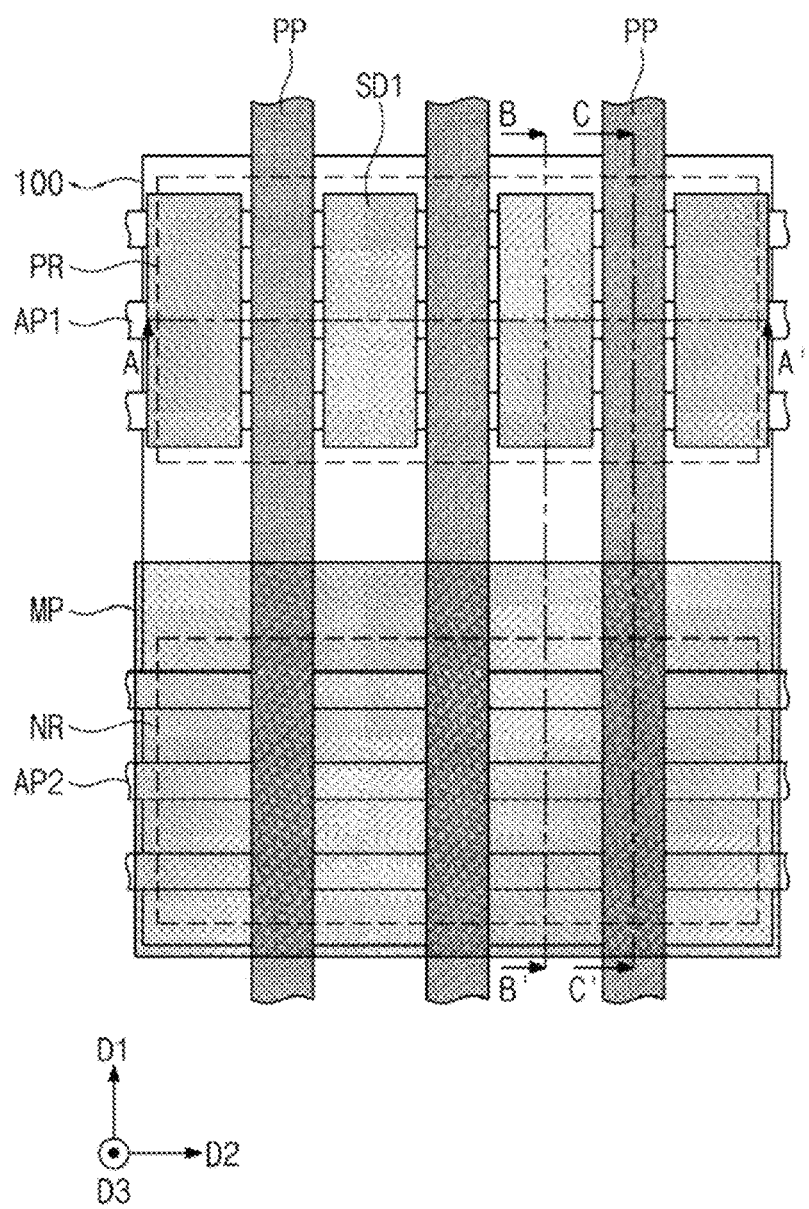
Figure 8A:
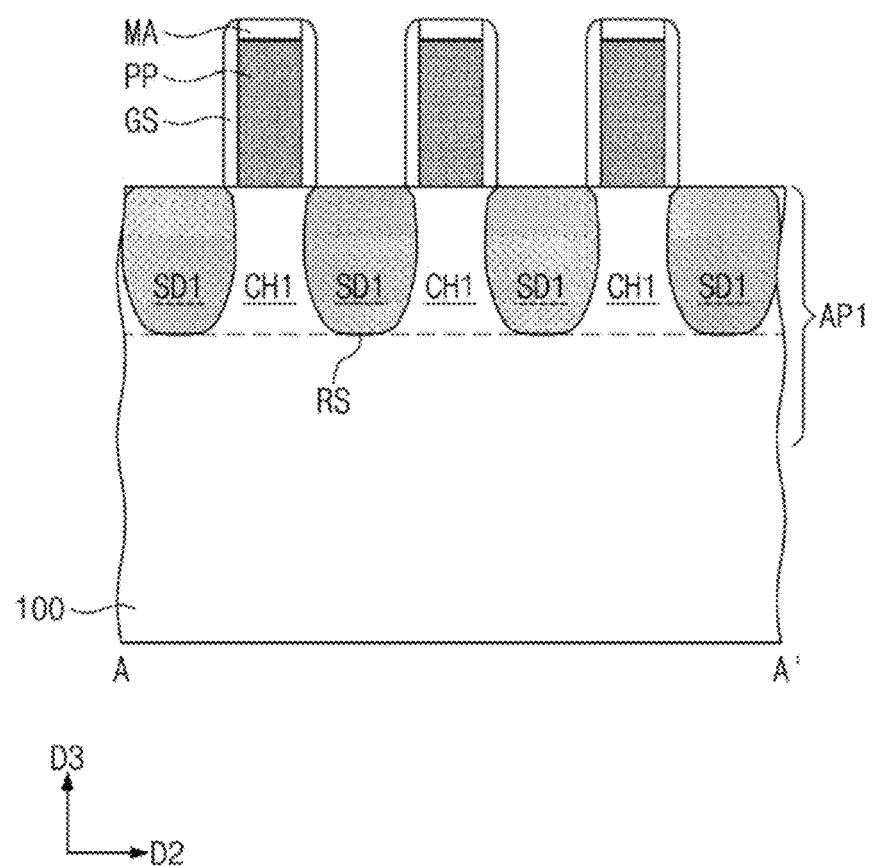
Figure 8B:
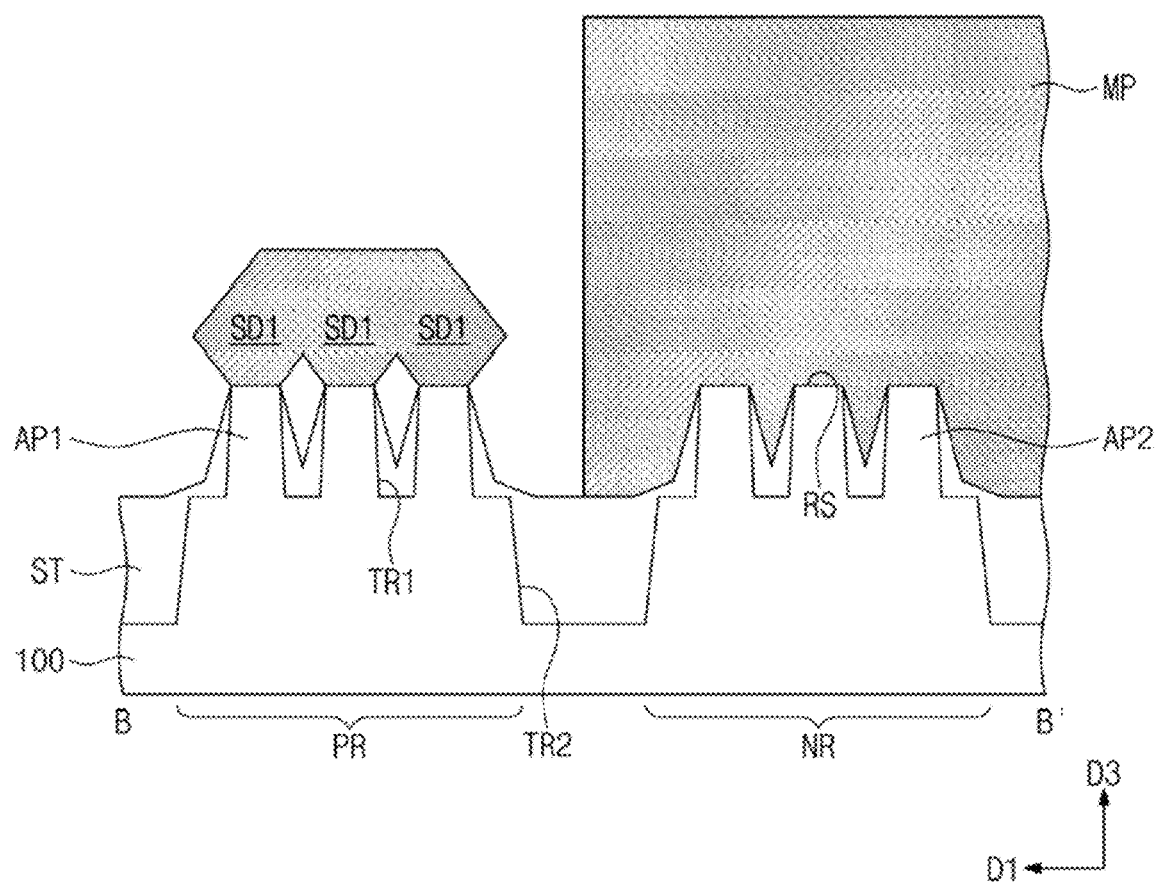
Figure 8C:
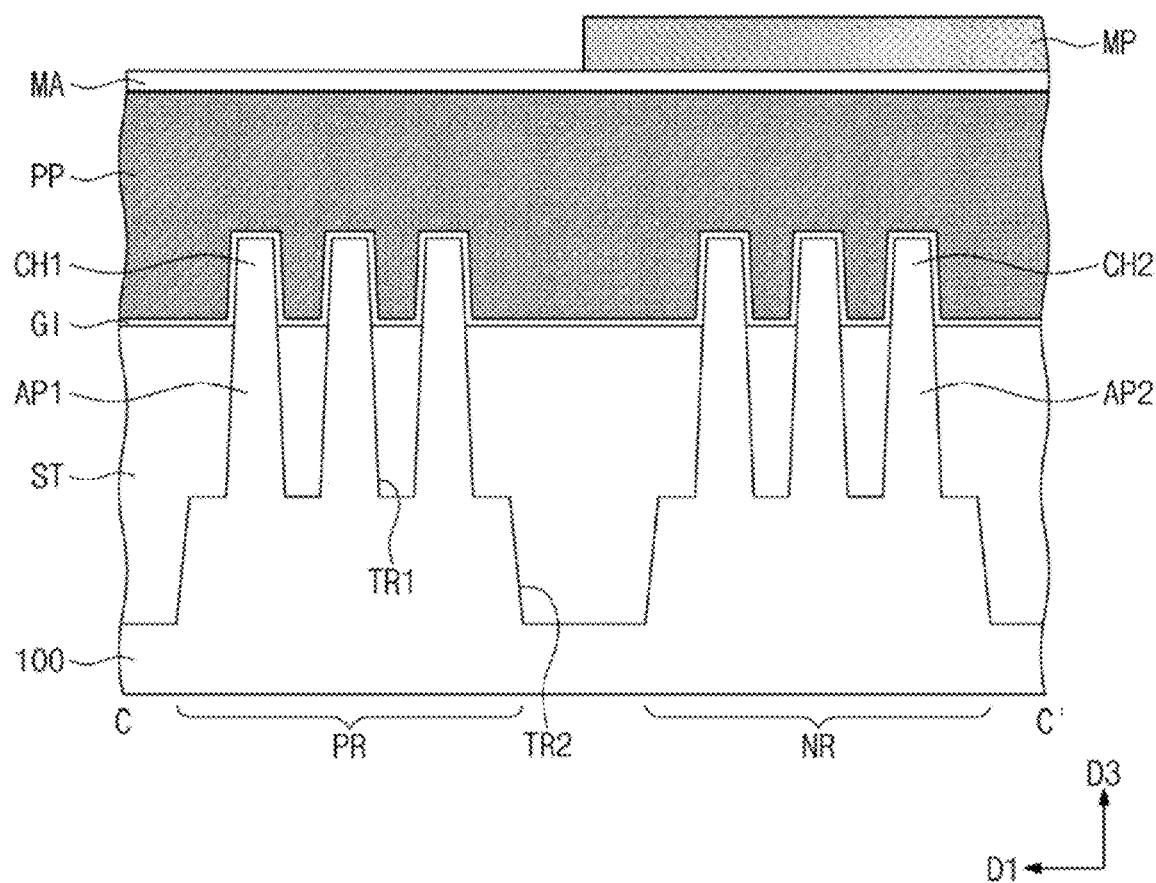
Figure 9:
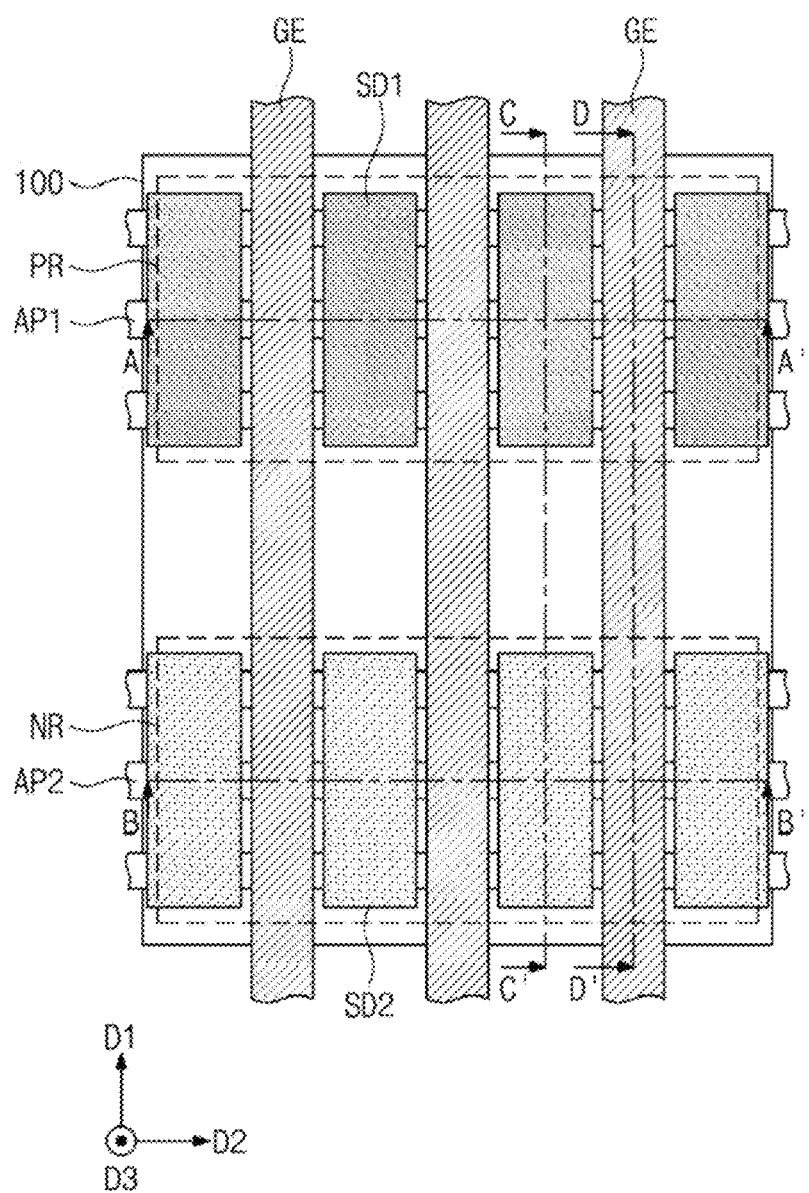

Referring to FIGS. 3 and 4, the substrate 100 including the first and second active regions PR and NR may be provided. The substrate 100 may be patterned to form the first and second active patterns AP1 and AP2. The first active patterns AP1 may be formed on the first active region PR, and the second active patterns AP2 may be formed on the second active region NR. The first trench TR1 may be formed between the first active patterns AP1 and between the second active patterns AP2.

The substrate 100 may be patterned to form the second trench TR2 between the first and second active regions PR and NR. The second trench TR2 may be formed to be deeper than the first trench TR1 (e.g., as measured in the third direction D3).

The device isolation layer ST may be formed on the substrate 100 to fill the first and second trenches TR1 and TR2. The device isolation layer ST may be formed of or include an insulating material (e.g., silicon oxide). The device isolation layer ST may be recessed to expose upper portions of the first and second active patterns AP1 and AP2. Accordingly, the upper portions of the first and second active patterns AP1 and AP2 may protrude vertically above the device isolation layer ST (e.g., in the third direction D3).

Referring to FIGS. 5 and 6A to 6C, sacrificial patterns PP may be formed to cross the first and second active patterns AP1 and AP2. The sacrificial patterns PP may be line-shaped or bar-shaped patterns extending in the first direction D1. In an implementation, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include polysilicon.

A pair of the gate spacers GS may be formed on both side surfaces of each of the sacrificial patterns PP. The gate spacers GS may also be formed on both side surfaces of each of the first and second active patterns AP1 and AP2. A portion of the side surfaces of each of the first and second active patterns AP1 and AP2 may not be covered with the device isolation layer ST and the sacrificial patterns PP and may be in contact with the gate spacers GS.

The formation of the gate spacers GS may include conformally forming a gate spacer layer on the substrate 100 and the anisotropically etching the gate spacer layer. The gate spacer layer may be formed of or include, e.g., SiCN, SiCON, or SiN. In an implementation, the gate spacer layer may be a multi-layered structure, which includes at least two different materials selected from SiCN, SiCON, and SiN.

Referring to FIGS. 7 and 8A to 8C, recesses RS may be formed in an upper portion of each of the first and second active patterns AP1 and AP2. A pair of the recesses RS may be formed at both sides of each of the sacrificial patterns PP. The formation of the recesses RS may include etching the upper portions of the first and second active patterns AP1 and AP2 using the hard mask patterns MA and the gate spacers GS as an etch mask. During the etching process, the gate spacers GS may be removed from both side surfaces of each of the first and second active patterns AP1 and AP2. The exposed portion of the device isolation layer ST may be recessed, during the etching process.

A first mask layer MP may be formed to selectively cover the second active patterns AP2. The first mask layer MP may be formed to selectively cover the second active region NR and to expose the first active region PR. The first mask layer MP may expose the first active patterns AP1.

The first source/drain patterns SD1 may be formed to fill the recesses RS of the first active patterns AP1 exposed by the first mask layer MP. In an implementation, the formation of the first source/drain pattern SD1 may include performing a selective epitaxial growth process using the exposed inner surface of the recess RS as a seed layer. The first source/drain patterns SD1 may be formed, and the first channel pattern CH1 may be defined between each pair of the first source/drain patterns SD1. In an implementation, the selective epitaxial growth process may include a chemical vapor deposition (CVD) process or a molecular beam epitaxy (MBE) process.

The first source/drain pattern SD1 may be formed of or include a second semiconductor material whose lattice constant is greater than a lattice constant of a first semiconductor material of the substrate 100. In an implementation, the first semiconductor material may be silicon (Si), and the second semiconductor material may be germanium (Ge). The first source/drain pattern SD1 may be formed of a plurality of stacked semiconductor layers. The formation of the first source/drain pattern SD1 may include sequentially forming the semiconductor layers. In an implementation, the semiconductor layers may constitute a buffer layer, a main layer, and a capping layer.

Referring to FIGS. 9 and 10A to 10D, the first mask layer MP may be removed. A second mask layer may be formed to selectively cover the first active patterns AP1. The second mask layer may selectively cover the first active region PR and may expose the second active region NR. The second mask layer may expose the second active patterns AP2.

The second source/drain patterns SD2 may be formed to fill the recesses RS of the second active patterns AP2 exposed by the second mask layer. In an implementation, the formation of the second source/drain patterns SD2 may include performing a selective epitaxial growth process using the exposed inner surfaces of the recesses RS as a seed layer. The second source/drain patterns SD2 may be formed of or include the same semiconductor element (e.g., silicon (Si)) as the first semiconductor material of the substrate 100. Thereafter, the second mask layer may be removed.

The first interlayered insulating layer 110 may be formed to cover the first and second source/drain patterns SD1 and SD2, the gate spacers GS, and the hard mask patterns MA. In an implementation, the first interlayered insulating layer 110 may be formed of or include silicon oxide.

A planarization process may be performed on the first interlayered insulating layer 110 to expose the top surfaces of the sacrificial patterns PP. The planarization of the first interlayered insulating layer 110 may be performed using an etch-back process or a chemical mechanical polishing (CMP) process. In an implementation, the first interlayered insulating layer 110 may have a top surface that is coplanar with the top surfaces of the sacrificial patterns PP and the top surfaces of the gate spacers GS.

Each of the sacrificial patterns PP may be replaced with the gate electrode GE and the gate dielectric pattern GI. In an implementation, the exposed sacrificial patterns PP may be selectively removed to form an empty space. The gate dielectric pattern GI may be formed in the empty space (that was formed by removing the sacrificial pattern PP). The gate electrode GE may be formed on the gate dielectric pattern GI to fill the empty space.

The gate dielectric pattern GI may be conformally formed by an atomic layer deposition (ALD) and/or a chemical oxidation process. In an implementation, the gate dielectric pattern GI may be formed of or include a high-k dielectric material. In an implementation, the gate dielectric pattern GI may be formed of or include a ferroelectric material.

The formation of the gate electrode GE may include forming a gate electrode layer on the gate dielectric pattern GI and planarizing the gate electrode layer. In an implementation, the gate electrode layer may include a first gate electrode layer, which may be formed of or includes a metal nitride, and a second gate electrode layer, which may be formed of or includes a low resistance metal.

An upper portion of the gate electrode GE may be selectively etched to recess the gate electrode GE. The recessed top surface of the gate electrode GE may be lower than the top surface of the first interlayered insulating layer 110 and the top surfaces of the gate spacers GS. The gate capping pattern GP may be formed on the recessed gate electrode GE. The formation of the gate capping pattern GP may include forming a gate capping layer to cover the recessed gate electrode GE and planarizing the gate capping layer to expose the top surface of the first interlayered insulating layer 110. In an implementation, the gate capping layer may be formed of or include, e.g., SiON, SiCN, SiCON, or SiN.

Referring to FIGS. 11 and 12A to 12D, the second interlayered insulating layer 120 may be formed on the first interlayered insulating layer 110. The second interlayered insulating layer 120 may be formed of or include silicon oxide or a low-k oxide material. In an implementation, the low-k oxide materials may include carbon-doped silicon oxide (e.g., SiCOH). The second interlayered insulating layer 120 may be formed by a CVD process.

The contact holes CNH may be formed to penetrate the second and first interlayered insulating layers 120 and 110 and to expose the first and second source/drain patterns SD1 and SD2.

The first contact CT1 may be formed to fill a lower region of each of the contact holes CNH. The first contact CT1 may be in contact with the first or second source/drain pattern SD1 and SD2. The formation of the first contact CT1 may include forming the first barrier pattern BM1 and the first conductive pattern FM1. In an implementation, a first barrier layer may be formed to fill the contact holes CNH. A first conductive layer may be formed on the first barrier layer to fill the contact holes CNH. The first barrier pattern BM1 and the first conductive pattern FM1 may be formed by performing a planarization process on the first barrier layer and the first conductive layer. The first barrier layer may be formed of or include a metal nitride, and the first conductive layer may be formed of or include a metallic material.

Next, an upper portion of the first conductive pattern FM1 may be recessed. The recess region RR may be defined by the top surface of the first conductive pattern FM1 and the inner side surface BIW of the first barrier pattern BM1, and the diffusion barrier layer INH may be formed on the recess region RR.

Referring back to FIGS. 1 and 2A to 2D, the second contact CT2 may be formed on the diffusion barrier layer INH to fill the upper region of the contact hole CNH. The formation of the second contact CT2 may include forming the second barrier pattern BM2 and the second conductive pattern FM2. In an implementation, a second barrier layer may be formed on the top surface of the diffusion barrier layer INH, and a second conductive layer may be formed on the second barrier layer. A planarization process may be performed on the second barrier layer and the second conductive layer to expose the top surface of the second interlayered insulating layer 120, and thus, the second barrier pattern BM2 and the second conductive pattern FM2 may be formed. The second barrier pattern BM2 may be formed to surround a side surface of the second conductive pattern FM2. The second barrier pattern BM2 and the second conductive pattern FM2 may have bottom surfaces that are in contact with the top surface of the diffusion barrier layer INH.

Figure 2A:
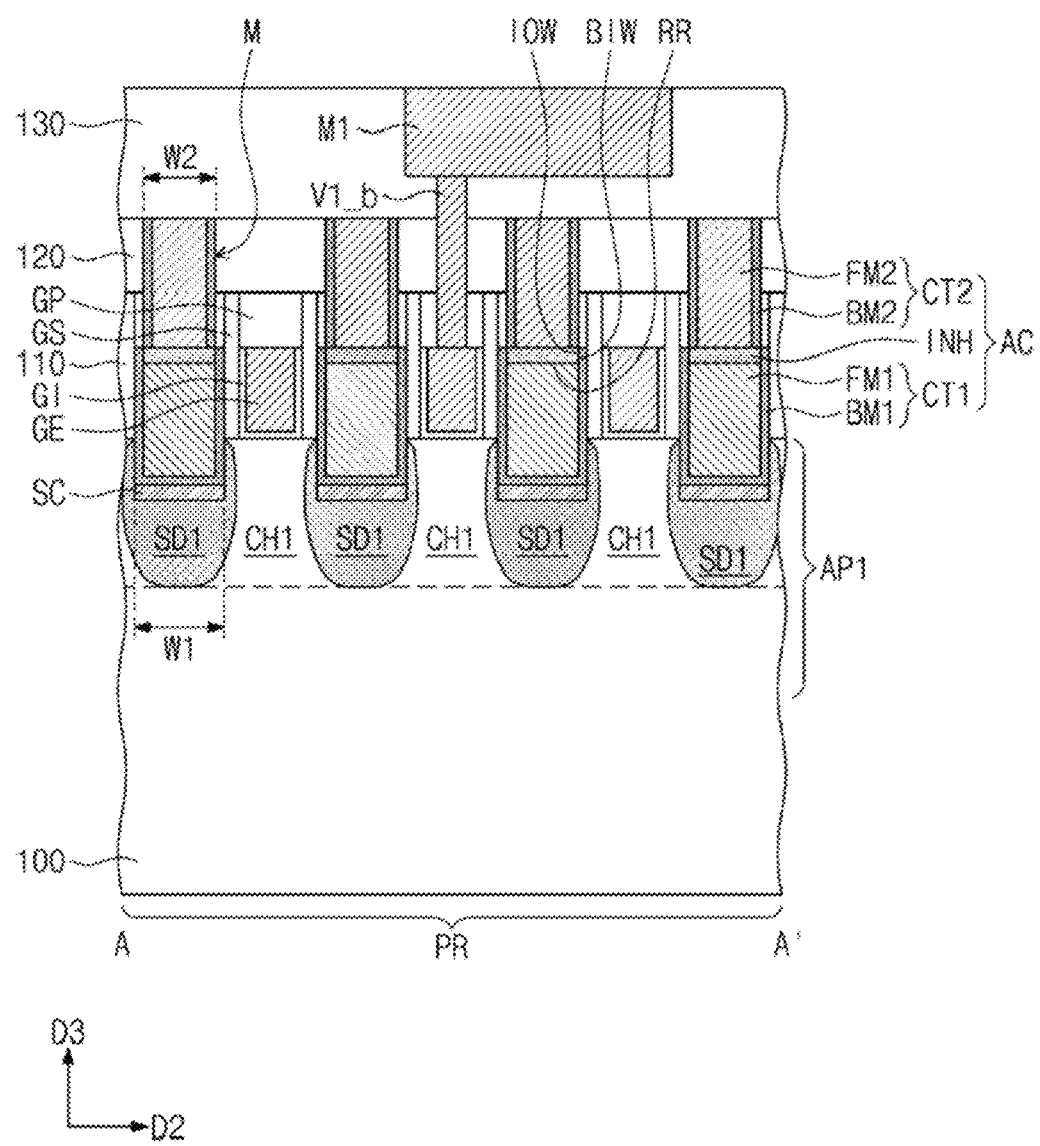
FIGS. 2A to 2D illustrate sectional views, which are respectively taken along lines A-A', B-B', C-C', and D-D' of FIG. 1.
Figure 2B:
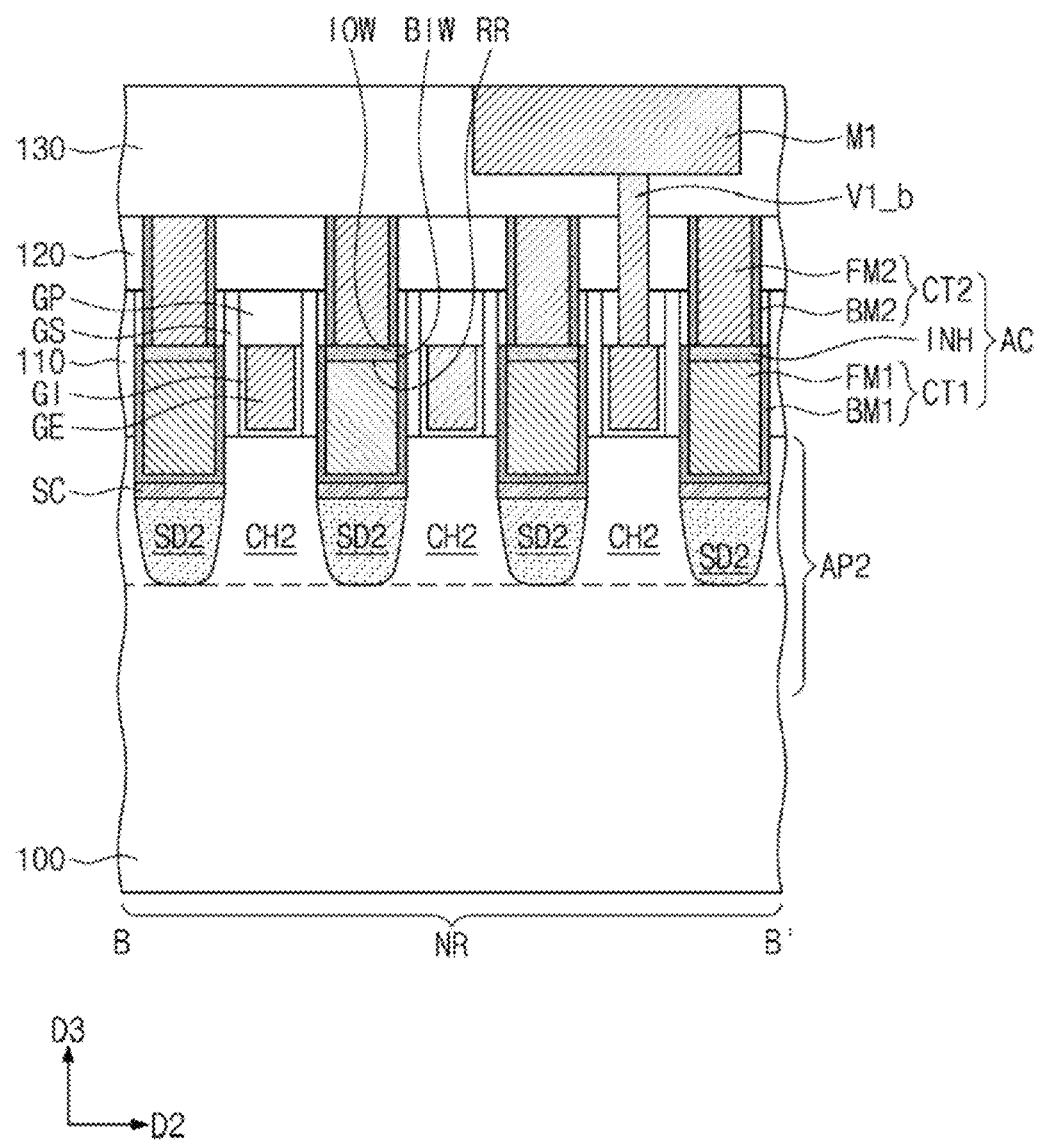
Figure 2C:
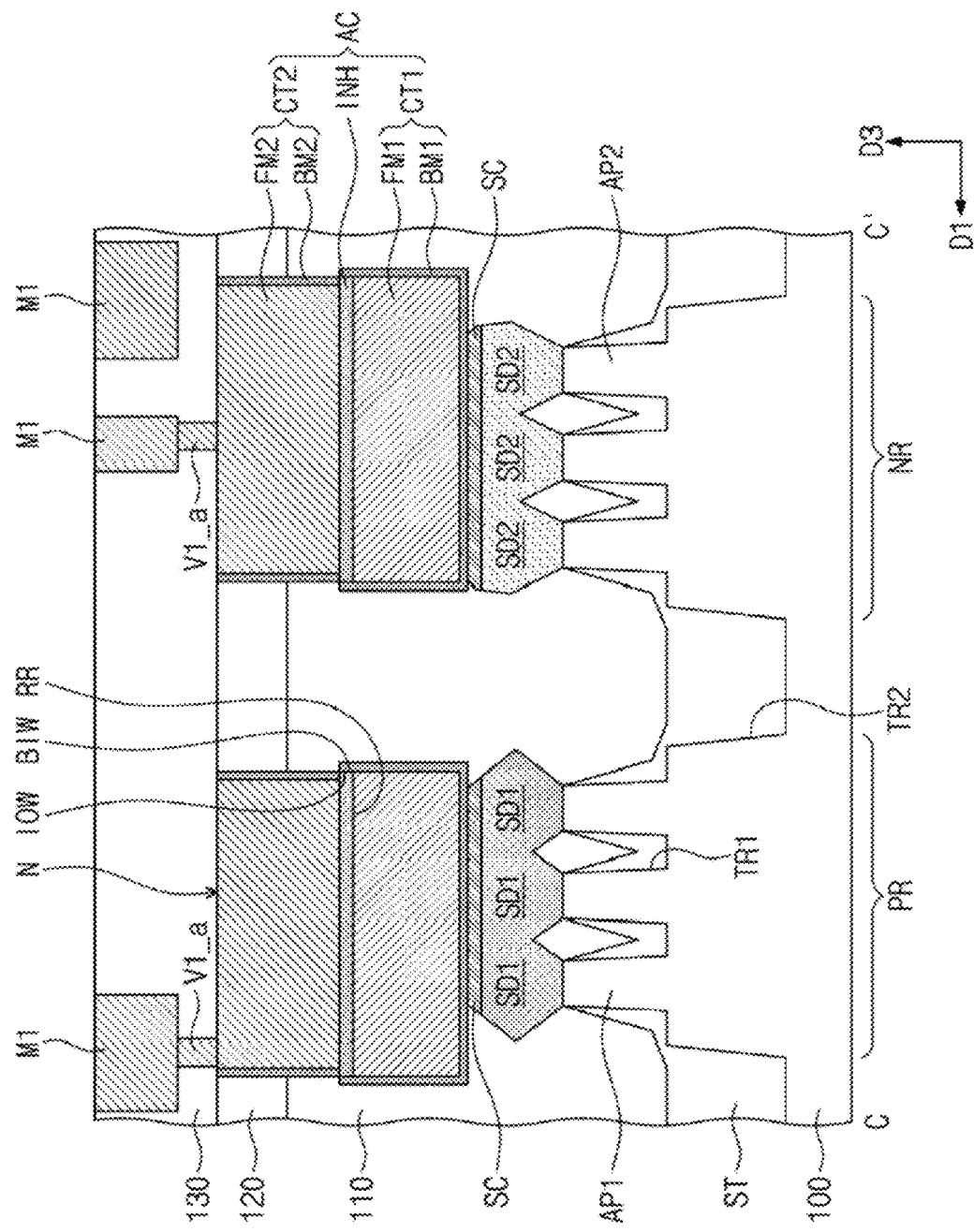
Figure 2D:
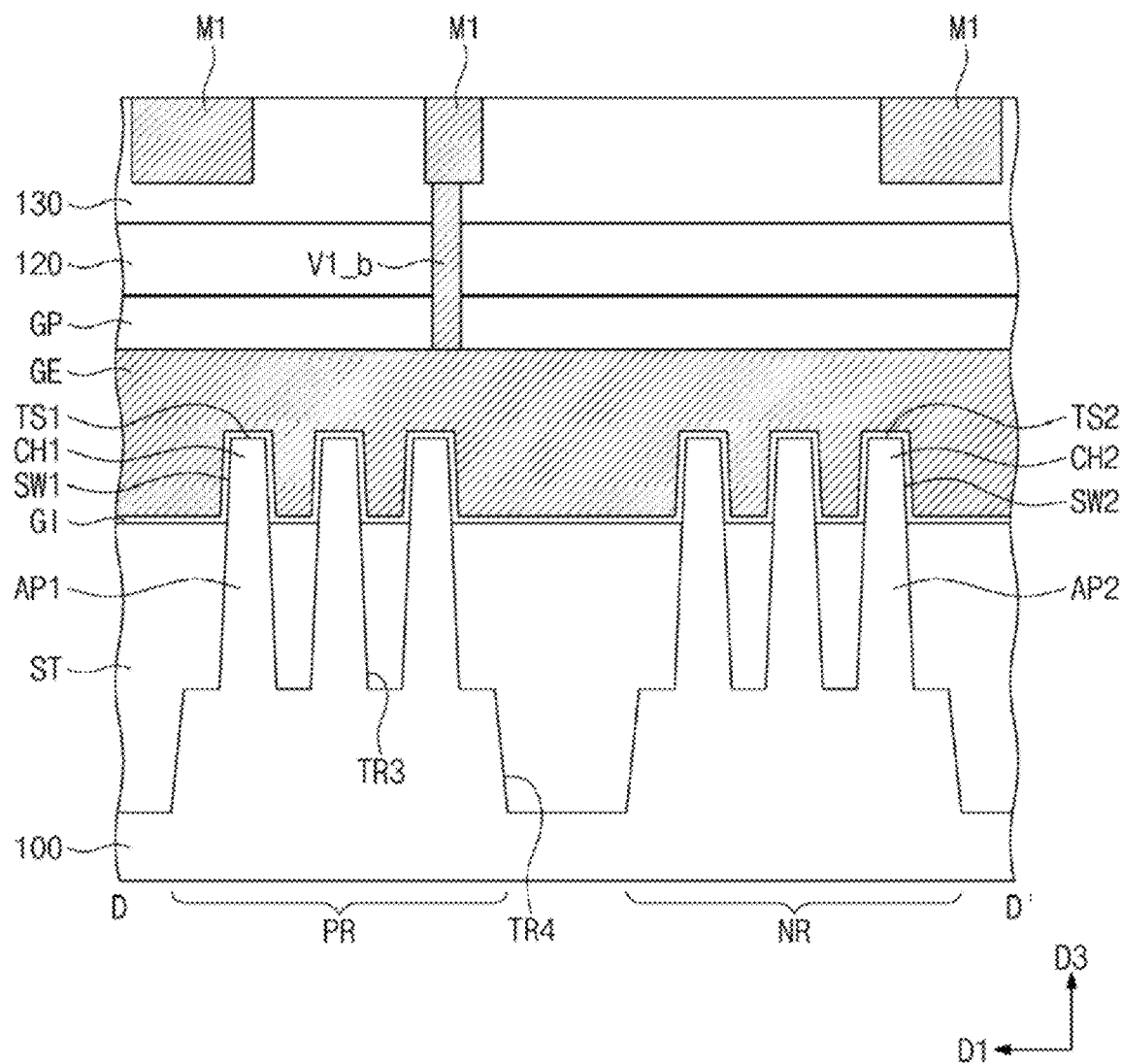
Figure 13:
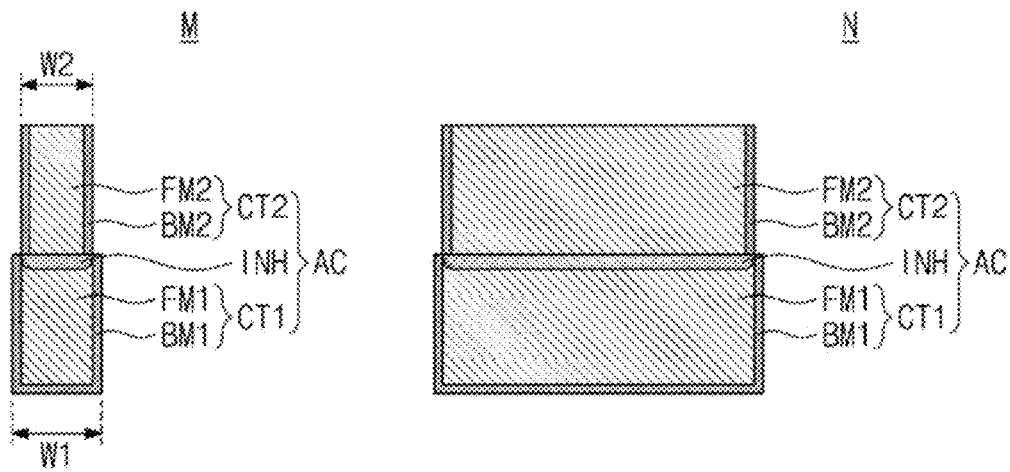
FIGS. 13 and 14 illustrate sectional views of an active contact according to an embodiment and in detail illustrating a region 'M' of FIG. 2A and a portion 'N' of FIG. 2C.
Figure 14:
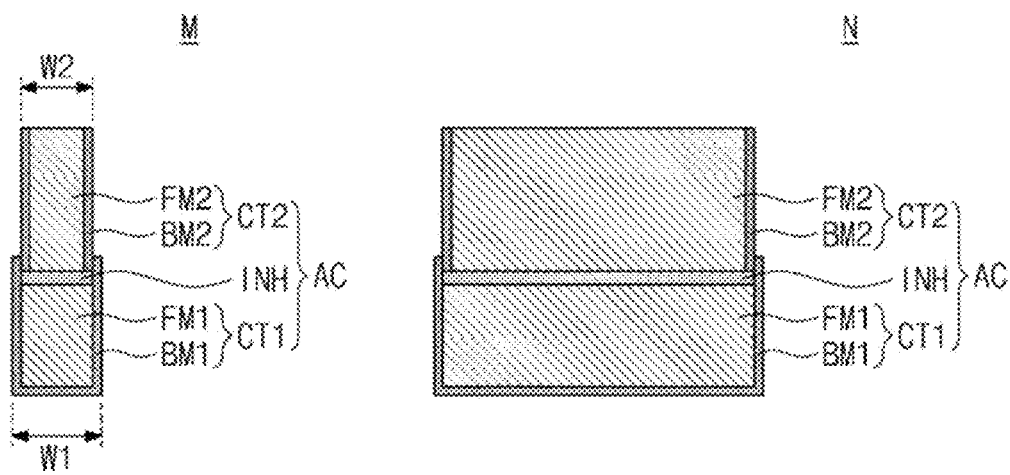

FIGS. 13 and 14 are sectional views of an active contact according to an embodiment and in detail illustrating a region 'M' of FIG. 2A and a portion 'N' of FIG. 2C. In the following description, an element previously described with reference to FIGS. 1 and 2A to 2D may be identified by the same reference number without repeating an overlapping description thereof, for the sake of brevity.

In an implementation, referring to FIG. 13, the diffusion barrier layer INH may have a rounded bottom surface. To realize such a shape of the diffusion barrier layer INH, an etching process may be performed to recess an exposed top surface of the first conductive pattern FM1. In an implementation, the shape of the top surface of the first conductive pattern FM1 may vary depending on the method of the etching process, and this means that by adjusting the etching process on the first conductive pattern FM1, the top surface of the first conductive pattern FM1 may have a rounded (e.g., concave) shape. Thus, the diffusion barrier layer INH on the first conductive pattern FM1 may be formed to have the rounded bottom (e.g., convex) surface.

Referring to FIG. 14, the diffusion barrier layer INH may have a top surface that is lower (e.g., closer to the substrate 100 in the third direction D3) than a top surface of the first barrier pattern BM1. Accordingly, the second barrier pattern BM2 and the second conductive pattern FM2 may have bottom surfaces that are lower than the top surface of the first barrier pattern BM1. An inner side surface of the first barrier pattern BM1 may be in contact with an outer side surface of the second barrier pattern BM2.

FIGS. 15A to 15D are sectional views, which are respectively taken along lines A-A', B-B', C-C', and D-D' of FIG. 1. In the following description, an element previously described with reference to FIGS. 1 and 2A to 2D may be identified by the same reference number without repeating an overlapping description thereof, for the sake of brevity.

Referring to FIGS. 1 and 15A to 15D, the substrate 100 including the first and second active regions PR and NR may be provided. The device isolation layer ST may be provided on the substrate 100. The device isolation layer ST may define the first active pattern AP1 and the second active pattern AP2 in an upper portion of the substrate 100. The first active pattern AP1 and the second active pattern AP2 may be defined on the first active region PR and the second active region NR, respectively.

The first active pattern AP1 may include the first channel patterns CH1, which are vertically stacked. The stacked first channel patterns CH1 may be spaced apart from each other in the third direction D3. The stacked first channel patterns CH1 may be overlapped with each other, when viewed in a plan view (e.g., along the third direction D3). The second active pattern AP2 may include the second channel patterns CH2, which are vertically stacked. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or include, e.g., silicon (Si), germanium (Ge), or silicon-germanium (SiGe).

The first active pattern AP1 may further include the first source/drain patterns SD1. The second channel patterns CH2 may be stacked between each adjacent pair of the first source/drain patterns SD1. The stacked first channel patterns CH1 may connect an adjacent pair of the first source/drain patterns SD1 to each other.

The second active pattern AP2 may further include the second source/drain patterns SD2. The second channel patterns CH2 may be stacked between each adjacent pair of the second source/drain patterns SD2. The stacked second channel patterns CH2 may connect an adjacent pair of the second source/drain patterns SD2 to each other.

The gate electrodes GE may cross the first and second channel patterns CH1 and CH2 and extend in the first direction D1. The gate electrode GE may be overlapped with the first and second channel patterns CH1 and CH2, when viewed in a plan view. A pair of the gate spacers GS may be on both side surfaces of the gate electrode GE. The gate capping pattern GP may be on the gate electrode GE.

Figure 15A:
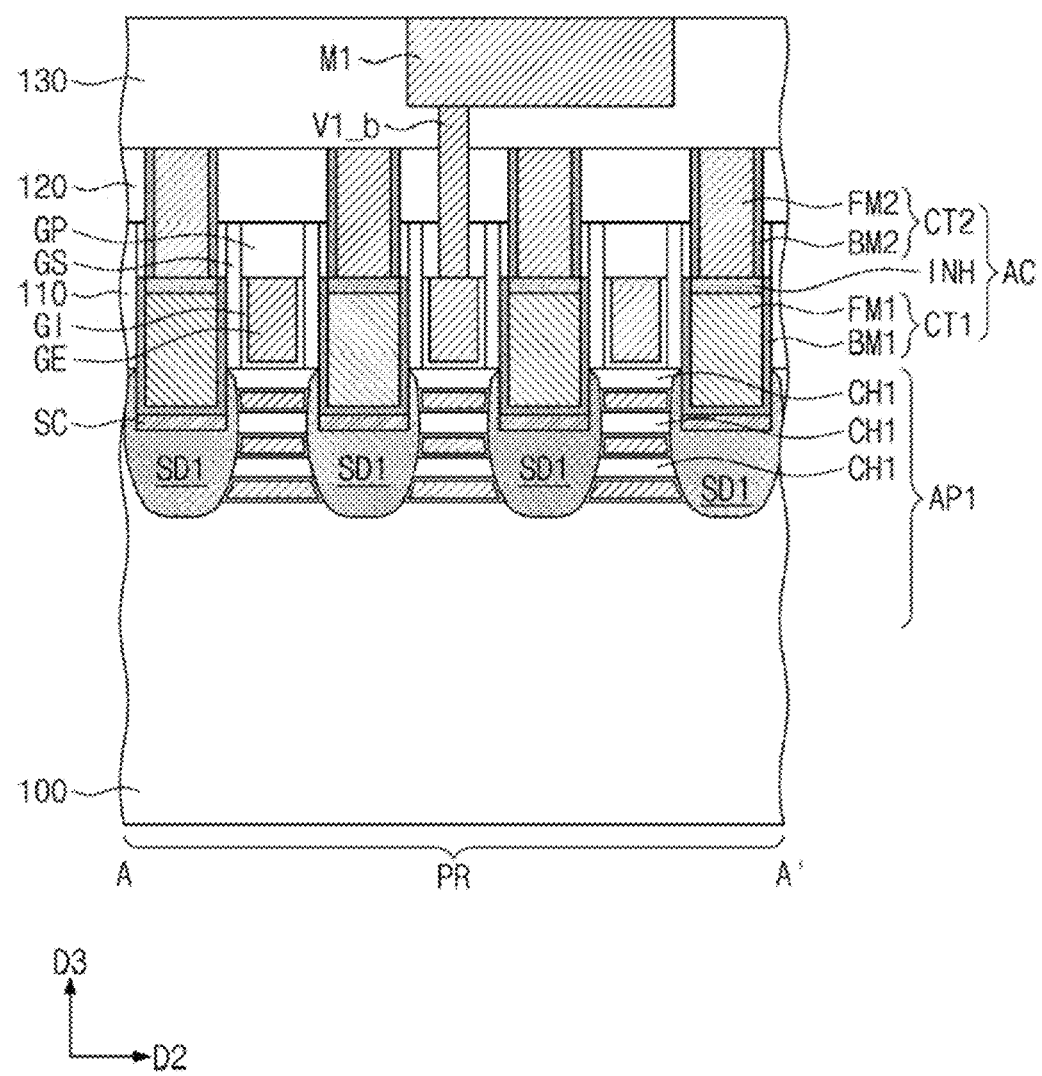
FIGS. 15A to 15D illustrate sectional views, which are respectively taken along lines A-A', B-B', C-C', and D-D' of FIG. 1.
Figure 15B:
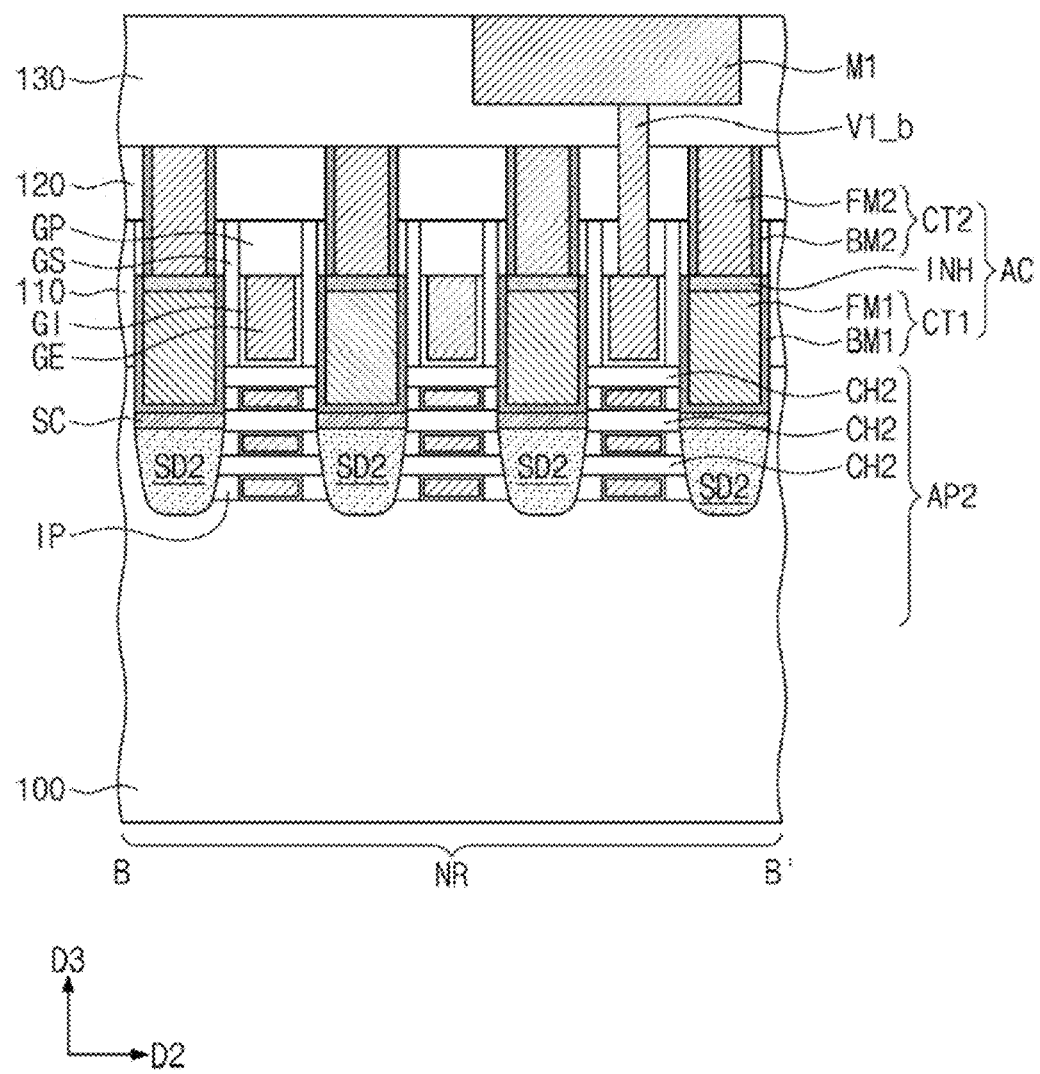
Figure 15C:
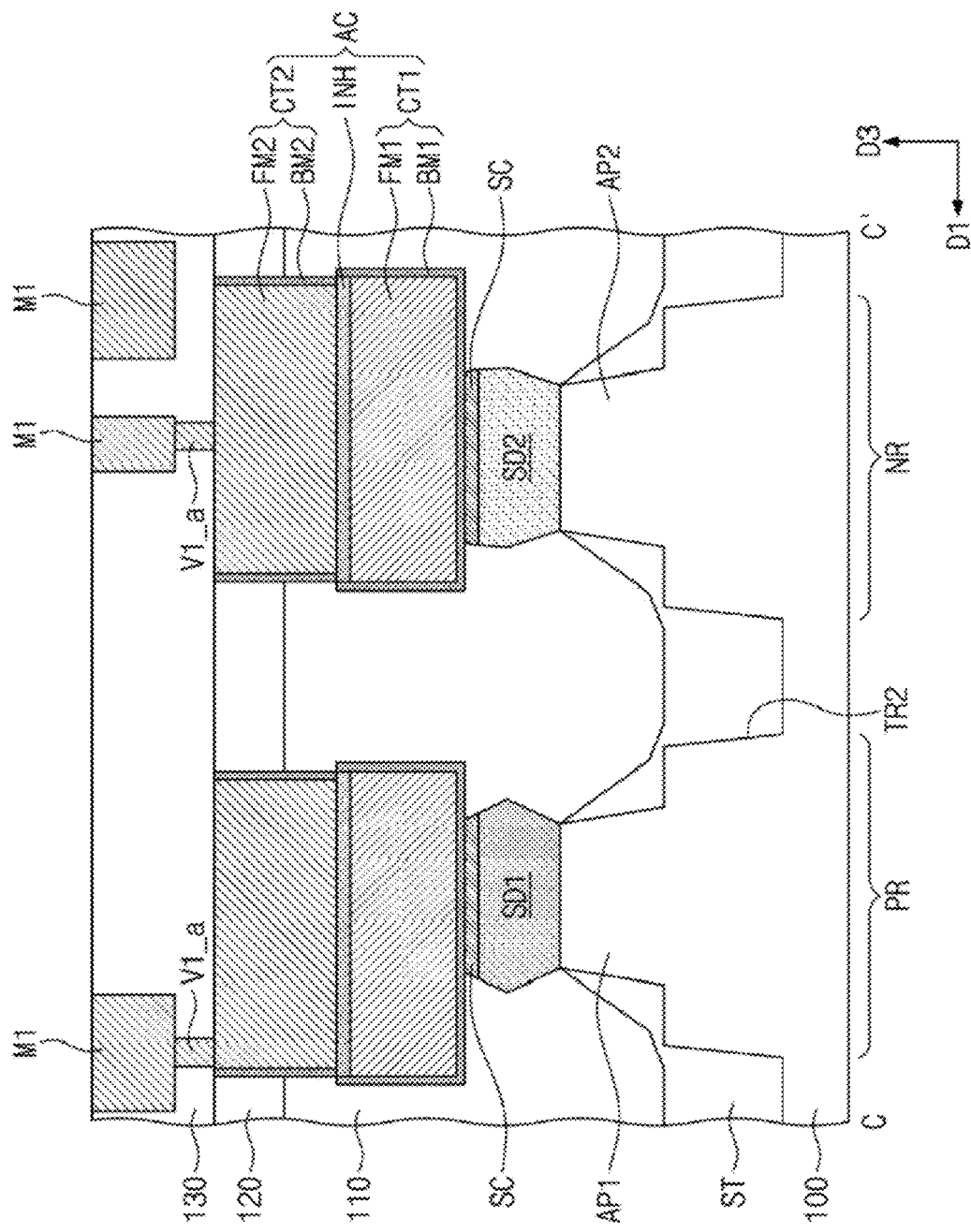
Figure 15D:
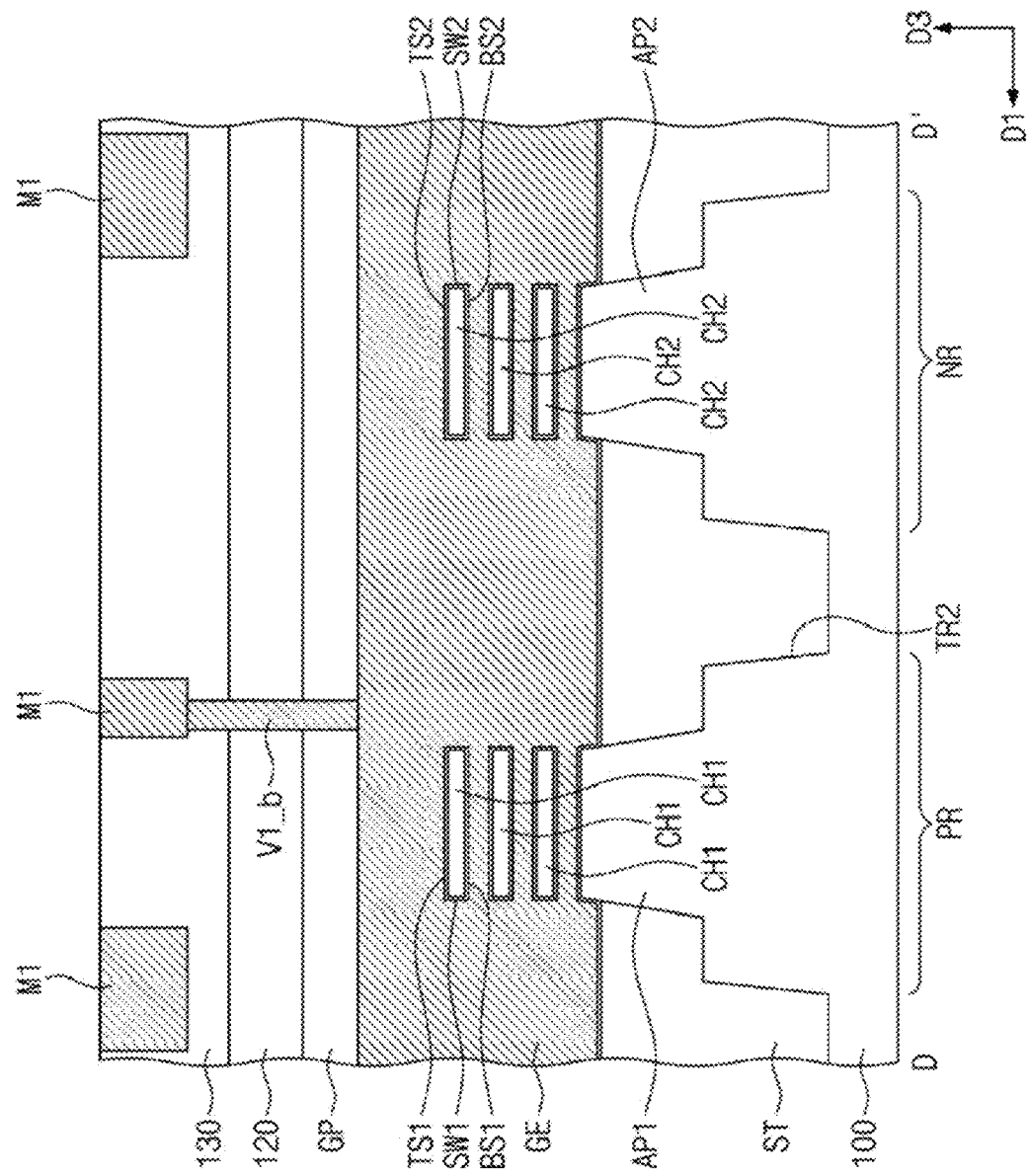

The gate electrode GE may surround each of the first and second channel patterns CH1 and CH2 (e.g., see FIG. 15D). The gate electrode GE may be on the first top surface TS1, at least one first side surface SW1, and a first bottom surface BS1 of the first channel pattern CH1. The gate electrode GE may be on the second top surface TS2, at least one second side surface SW2, and a second bottom surface BS2 of the second channel pattern CH2. In an implementation, the gate electrode GE may enclose top, bottom, and both side surfaces of each of the first and second channel patterns CH1 and CH2. A transistor according to the present embodiment may be a three-dimensional field-effect transistor (e.g., a multi-bridge channel field-effect transistor (MBCFET)), in which the gate electrode GE three-dimensionally surrounds the channel patterns CH1 and CH2.

The gate dielectric pattern GI may be between each of the first and second channel patterns CH1 and CH2 and the gate electrode GE. The gate dielectric pattern GI may surround each of the first and second channel patterns CH1 and CH2.

On the second active region NR, an insulating pattern IP may be between the gate dielectric pattern GI and the second source/drain pattern SD2 (e.g., in the second direction D2). The gate electrode GE may be spaced apart from the second source/drain pattern SD2 by the gate dielectric pattern GI and the insulating pattern IP. In an implementation, the insulating pattern IP may not be provided on the first active region PR.

The first interlayered insulating layer 110 and the second interlayered insulating layer 120 may be on the substrate 100. The active contacts AC may penetrate the first and second interlayered insulating layers 110 and 120 and may be connected to the first and second source/drain patterns SD1 and SD2, respectively. Each of the active contacts AC may include the first contact CT1, the diffusion barrier layer INH on the first contact CT1, and the second contact CT2 on the diffusion barrier layer INH. The first and second contacts CT1 and CT2 and the diffusion barrier layer INH may be configured to have substantially the same features as those described with reference to FIGS. 2A to 2D.

Figure 16:
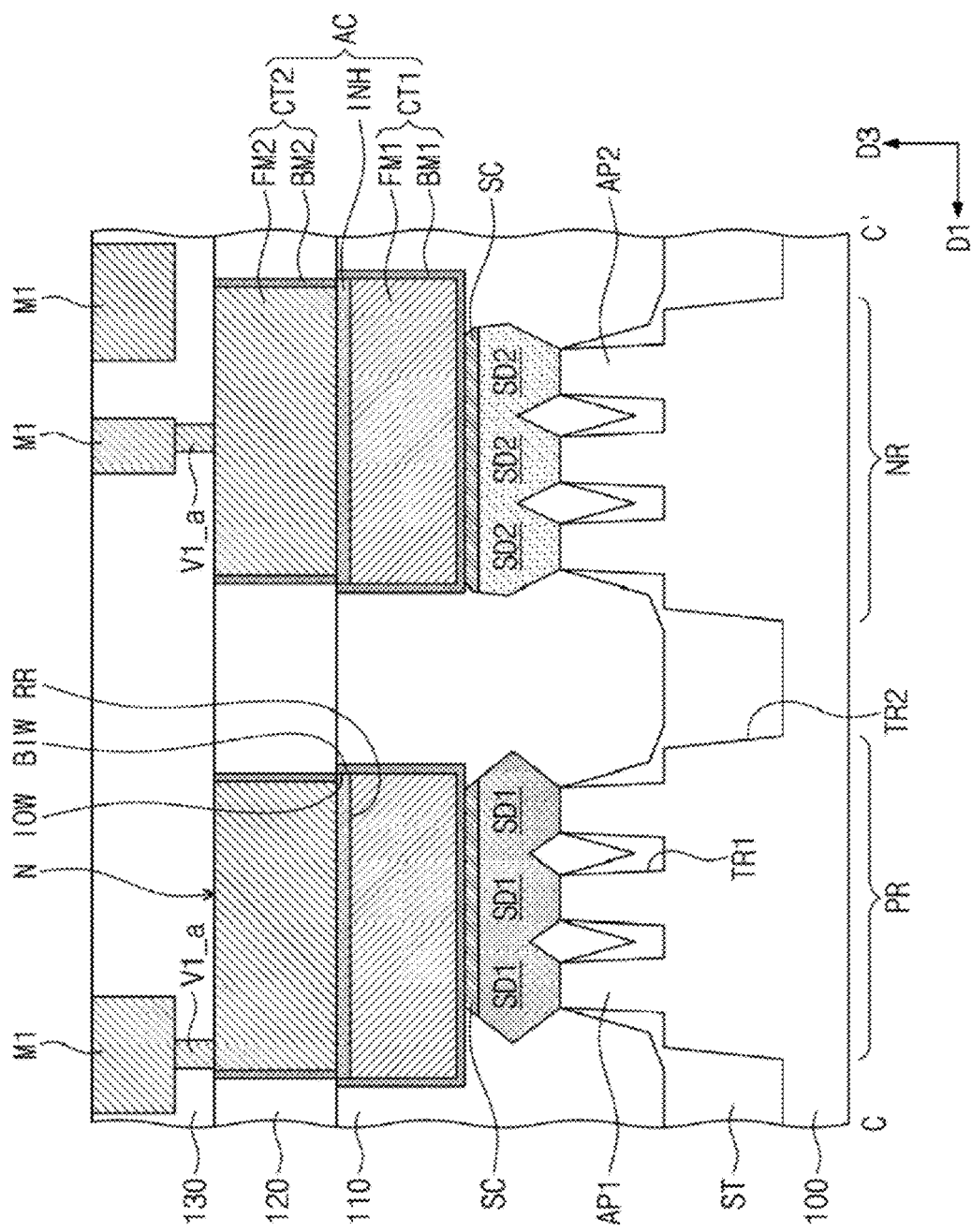
FIG. 16 illustrates a sectional view of a semiconductor device according to an embodiment.

FIG. 16 illustrates a section view of a semiconductor device according to an embodiment.

Referring to FIG. 16, a lower region of each of the contact holes CNH may be formed to penetrate the first interlayered insulating layer 110 and to expose the first and second source/drain patterns SD1 and SD2.

The first contact CT1 may be formed to fill the lower region of each of the contact holes CNH. The first contact CT1 may be in contact with the first or second source/drain pattern SD1 and SD2. The formation of the first contact CT1 may include forming the first barrier pattern BM1 and the first conductive pattern FM1. In an implementation, a first barrier layer may be formed to fill the lower region of each of the contact holes CNH. A first conductive layer may be formed on the first barrier layer to fill the lower region of each of the contact holes CNH. The first barrier pattern BM1 and the first conductive pattern FM1 may be formed by performing a planarization process on the first barrier layer and the first conductive layer to expose the top surface of the first interlayered insulating layer 110. The first barrier layer may be formed of or include a metal nitride, and the first conductive layer may be formed of or include a metallic material.

Next, the second interlayered insulating layer 120 may be formed on the first interlayered insulating layer 110. The second interlayered insulating layer 120 may expose the top surface of the first conductive pattern FM1, and may not expose the top surface of the first barrier pattern BM1. In other words, the second interlayered insulating layer 120 may cover a top surface of the gate capping pattern GP, top surfaces of the gate spacers, and the top surface of the first barrier pattern BM1.

Next, an upper portion of the first conductive pattern FM1 may be recessed. The recess region RR may be defined by the top surface of the first conductive pattern FM1 and the inner side surface BIW of the first barrier pattern BM1, and the diffusion barrier layer INH may be formed on the recess region RR.

Next, the second contact CT2 may be formed on the diffusion barrier layer INH to fill an upper region of each of the contact holes CNH. In an implementation, a width of the upper region of each of the contact holes CNH in the first direction D1 or the second direction D2 is smaller than a width of the lower region of each of the contact holes CNH in the first direction D1 or the second direction D2. The formation of the second contact CT2 may include forming the second barrier pattern BM2 and the second conductive pattern FM2. In an implementation, a second barrier layer may be formed on the top surface of the diffusion barrier layer INH, and a second conductive layer may be formed on the second barrier layer. A planarization process may be performed on the second barrier layer and the second conductive layer to expose the top surface of the second interlayered insulating layer 120, and thus, the second barrier pattern BM2 and the second conductive pattern FM2 may be formed. The second barrier pattern BM2 may be formed to surround a side surface of the second conductive pattern FM2. The second barrier pattern BM2 and the second conductive pattern FM2 may have bottom surfaces that are in contact with the top surface of the diffusion barrier layer INH.

In an implementation, the top surface of the diffusion barrier layer INH may be coplanar with the top surface of the first barrier pattern BM1 of the first contact CT1 and with a top surface of the first interlayered insulating layer 110.

Also, a bottom surface of the second conductive pattern FM2 and a bottom surface of the second barrier pattern BM2 may be coplanar with the top surface of the first interlayered insulating layer 110.

According to an embodiment, an active contact of a semiconductor device may be formed to have a dual contact structure including first and second contacts, and a diffusion barrier layer therebetween. In this case, it is possible to improve the reliability of the semiconductor device. In addition, the diffusion barrier layer may help prevent a metallic element in the active contact from being diffused into neighboring patterns and may help prevent performance of the semiconductor device from being deteriorated.

One or more embodiments may provide a semiconductor device including a field effect transistor.

One or more embodiments may provide a semiconductor device with improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
    forming an active pattern on a substrate;
    forming a sacrificial pattern crossing the active pattern;
    forming a source/drain pattern in an upper portion of the active pattern exposed by the sacrificial pattern;
    replacing the sacrificial pattern with a gate electrode;
    forming an interlayered insulating layer on the source/drain pattern and the gate electrode;
    forming a contact hole penetrating the interlayered insulating layer and exposing the source/drain pattern;
    forming a first contact filling a lower portion of the contact hole and being in contact with the source/drain pattern, the forming of the first contact including forming a first barrier pattern conformally covering an inside of the contact hole and forming a first conductive pattern on the first barrier pattern;
    forming a diffusion barrier layer on the first conductive pattern of the first contact; and
    forming a second contact filling an upper portion of the contact hole on the first contact, the forming of the second contact including forming a second barrier pattern covering an upper sidewall of the contact hole and forming a second conductive pattern surrounded by the second barrier pattern,
    wherein the second conductive pattern is selectively deposited on the upper sidewall of the contact hole.

2. The method of claim 1, wherein forming the diffusion barrier layer includes:
    recessing an upper portion of the first conductive pattern; and
    filling a space surrounded by a top surface of the first conductive pattern and an inner sidewall of the first barrier pattern with a diffusion barrier material.

3. The method of claim 1, wherein each of a top surface of the first conductive pattern and a bottom surface of the diffusion barrier layer has a rounded surface.

4. The method of claim 1, wherein a top surface of the diffusion barrier layer is lower than a top surface of the first barrier pattern.

5. The method of claim 4, wherein an inner sidewall of the first barrier pattern is in contact with an outer sidewall of the second barrier pattern.

6. The method of claim 1, wherein the diffusion barrier layer is formed to a thickness of 5 Å to 50 Å.

7. The method of claim 1, wherein the diffusion barrier layer is formed of acetylacetone or bis(diethylamino) silane.

8. The method of claim 1, further comprising forming a silicide pattern on the source/drain pattern between forming the contact hole and forming the first contact.

9. The method of claim 8, wherein the first barrier pattern extends between the first conductive pattern and the silicide pattern.

10. The method of claim 1, wherein a width of the first contact is larger than a width of the second contact.

11. The method of claim 10, wherein an outer sidewall of the diffusion barrier layer is aligned with an outer sidewall of the second barrier pattern.

12. The method of claim 1, wherein:
one sidewall of the first contact is spaced apart from one sidewall of the source/drain pattern, in a plan view, and
another sidewall of the first contact opposing to the one sidewall is located on the source/drain pattern, in a plan view.

13. A method of fabricating a semiconductor device, the method comprising:
forming a trench defining an active pattern on a substrate;
forming a device isolation layer filling the trench;
forming a sacrificial pattern crossing the active pattern;
forming a recess in an upper portion of the active pattern exposed by the sacrificial pattern;
forming a source/drain pattern filling the recess;
forming a first interlayered insulating layer covering the source/drain pattern;
replacing the sacrificial pattern with a gate electrode;
forming a gate capping pattern on the gate electrode;
forming a second interlayered insulating layer on the first interlayered insulating layer and the gate capping pattern;
forming a contact hole penetrating the first and second interlayered insulating layers and exposing the source/drain pattern;
forming a first contact filling a lower portion of the contact hole and being in contact with the source/drain pattern, the forming of the first contact including forming a first barrier pattern conformally covering an inside of the contact hole and forming a first conductive pattern on the first barrier pattern;
forming a diffusion barrier layer on the first conductive pattern of the first contact; and
forming a second contact filling an upper portion of the contact hole on the first contact, the forming of the second contact including forming a second barrier pattern covering an upper sidewall of the contact hole and forming a second conductive pattern surrounded by the second barrier pattern,
wherein the second conductive pattern is in direct contact with the diffusion barrier layer.

14. The method of claim 13, wherein the upper portion of the active pattern is vertically protruded above the device isolation layer.

15. The method of claim 13, further comprising:
forming a third interlayered insulating layer on the second contact;
forming a first via penetrating the third interlayered insulating layer and connected with the second conductive pattern of the second contact; and
forming a first interconnection line connected with the first via.

16. The method of claim 15, further comprising:
forming a second via penetrating the third interlayered insulating layer, the second interlayered insulating layer, and the gate capping pattern and connected with the gate electrode; and
forming a second interconnection line connected with the second via.

17. A method of fabricating a semiconductor device, the method comprising:
forming an active pattern including first and second semiconductor patterns which are alternately and repeatedly stacked on a substrate;
forming a sacrificial pattern crossing the active pattern;
forming a source/drain pattern in an upper portion of the active pattern exposed by the sacrificial pattern;
replacing the second semiconductor patterns and the sacrificial pattern with a gate electrode;
forming an interlayered insulating layer on the source/drain pattern and the gate electrode;
forming a contact hole penetrating the interlayered insulating layer and exposing the source/drain pattern;
forming a first contact filling a lower portion of the contact hole and being in contact with the source/drain pattern, the forming of the first contact including forming a first barrier pattern conformally covering an inside of the contact hole and forming a first conductive pattern on the first barrier pattern;
forming a diffusion barrier layer on the first conductive pattern of the first contact; and
forming a second contact filling an upper portion of the contact hole on the first contact, the forming of the second contact including forming a second barrier pattern covering an upper sidewall of the contact hole and forming a second conductive pattern surrounded by the second barrier pattern,
wherein the second conductive pattern is in direct contact with the diffusion barrier layer.

18. The method of claim 17, wherein the second semiconductor patterns are formed of a material having etch selectivity with respect to the first semiconductor patterns.

19. The method of claim 17, wherein forming the diffusion barrier layer includes:
recessing an upper portion of the first conductive pattern; and
filling a space surrounded by a top surface of the first conductive pattern and an inner sidewall of the first barrier pattern with a diffusion barrier material.

20. The method of claim 17, wherein each of a top surface of the first conductive pattern and a bottom surface of the diffusion barrier layer has a rounded surface.

* * * * *